(12) United States Patent
Müller

(10) Patent No.: US 11,158,361 B2
(45) Date of Patent: Oct. 26, 2021

(54) MEMORY CELL ARRANGEMENT AND METHODS THEREOF

(71) Applicant: Ferroelectric Memory GmbH, Dresden (DE)

(72) Inventor: Stefan Müller, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 0 days.

(21) Appl. No.: 16/870,013

(22) Filed: May 8, 2020

(65) Prior Publication Data

US 2021/0005238 A1 Jan. 7, 2021

(30) Foreign Application Priority Data

Jul. 5, 2019 (DE) .................. 10 2019 118 295.6

(51) Int. Cl.
*G11C 11/22* (2006.01)
*H01L 27/1159* (2017.01)

(52) U.S. Cl.
CPC ........ *G11C 11/223* (2013.01); *G11C 11/2255* (2013.01); *G11C 11/2257* (2013.01); *G11C 11/2273* (2013.01); *G11C 11/2275* (2013.01); *H01L 27/1159* (2013.01)

(58) Field of Classification Search
CPC .............. G11C 11/223; G11C 11/2257; G11C 11/2255; G11C 11/2275; G11C 11/2273; H01L 27/1159
See application file for complete search history.

(56) References Cited

U.S. PATENT DOCUMENTS

| | | | |
|---|---|---|---|
| 2004/0057274 A1* | 3/2004 | Dimmler ................. | G11C 11/22 365/145 |
| 2016/0027490 A1 | 1/2016 | Muller | |
| 2020/0273521 A1* | 8/2020 | Fackenthal ............ | G11C 16/26 |

FOREIGN PATENT DOCUMENTS

EP    1 308 959 B1    7/2008

* cited by examiner

*Primary Examiner* — Tri M Hoang
(74) *Attorney, Agent, or Firm* — Hickman Becker Bingham Ledesma LLP; Malgorzata A. Kulczycka

(57) ABSTRACT

A memory cell arrangement is provided that may include: a plurality of memory cells including one or more memory cells to be read out and one or more memory cells not to be read out; a control circuit defining a base voltage and configured to: apply a select voltage, a first readout voltage and a second readout voltage, to one word-line and to a source/bit-line pair corresponding to the one or more memory cells to be read out, respectively; apply a voltage that is substantially the base voltage to one or more word-lines corresponding to the one or more memory cells not to be read out; wherein both the first readout voltage and the second readout voltage are provided with an offset to the base voltage, and wherein the first readout voltage and the second readout voltage are different from one another.

20 Claims, 6 Drawing Sheets

MEMORY CELL ARRANGEMENT AND METHODS THEREOF

CROSS REFERENCE TO RELATED APPLICATIONS

This application claims the benefit of German Patent Application No. 10 2019 118 295.6 filed Jul. 5, 2019, which is incorporated by reference herein in its entirety.

TECHNICAL FIELD

Various aspects relate to a memory cell arrangement, and methods thereof, e.g. a method for operating a memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for writing (e.g. programming and/or erasing) and/or reading the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
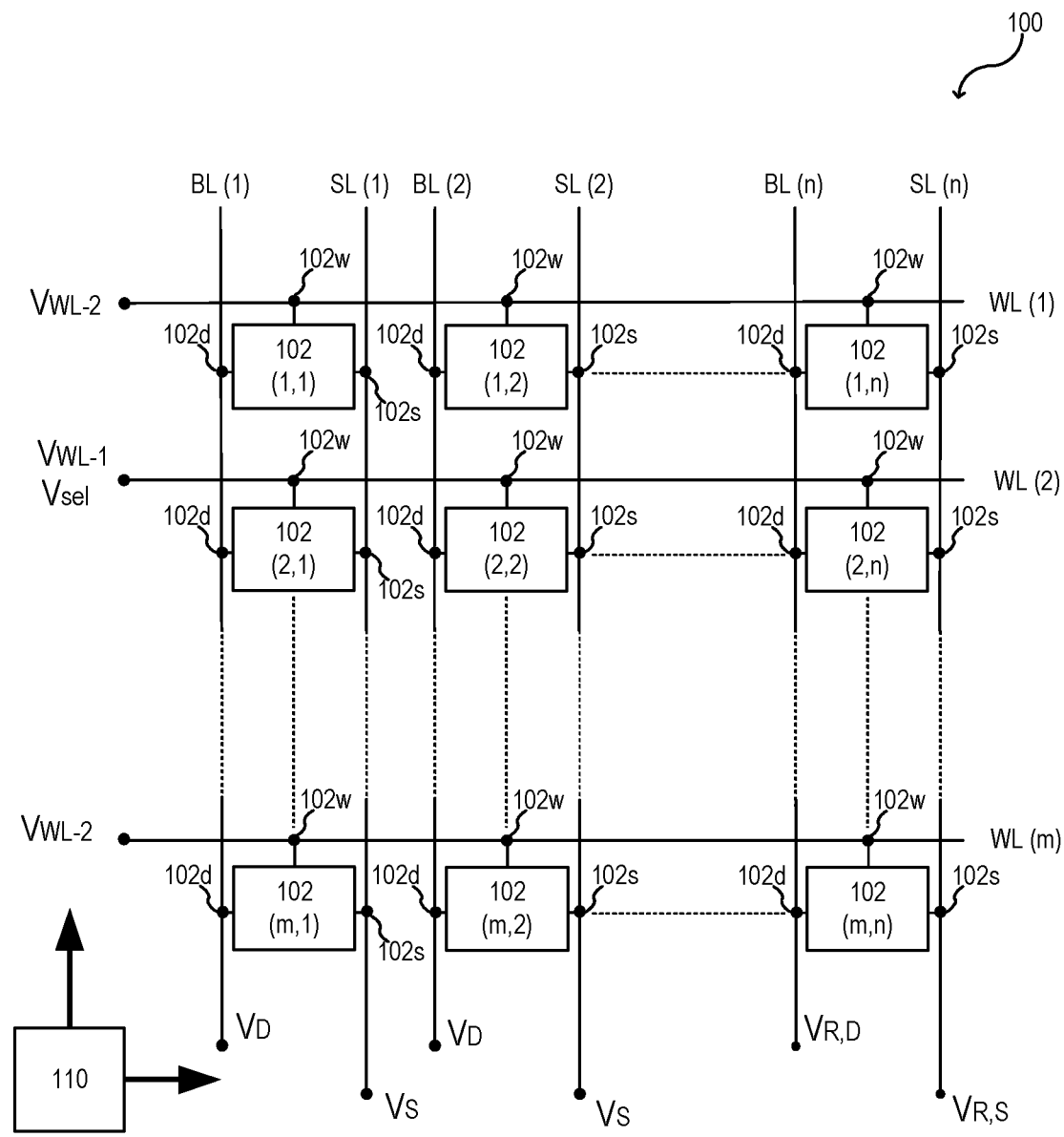
FIG. 1A schematically shows a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g. arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more readout voltages", "one or more gate voltages", "a base voltage", "one or more source/drain voltages", "one or more word-line voltages", and the like. As an example, the term "gate voltage" may be used herein to denote a voltage that is provided to a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V).

The base voltage of an electrical circuit may be defined by the power supply used to operate the electronic circuit. As another example, the term "source/drain voltage" may be used herein to denote a voltage that is provided to a source/drain node or a source/drain terminal of a transistor or a memory cell, as examples. As another example, the term "control-line voltage" may be used herein to denote a voltage that is provided to a control-line, e.g., of a memory cell arrangement (for example a "word-line voltage" may be provided to a "word-line", a "bit-line voltage" may be provided to a bit-line, and a "source-line voltage" may be provided to a source-line).

Illustratively, a voltage provided to a node may assume any suitable value depending on the intended operation of the circuit including the node. For example, a gate voltage (referred to as $V_G$) may be varied depending on the intended operation of a transistor or a memory cell. Analogously, a source voltage (referred to as $V_S$) and/or a drain voltage (referred to as $V_D$) may be varied depending on the intended operation of a transistor or a memory cell. A voltage provided to a node may be defined by the respective potential applied to that node relative to the base voltage (referred to as $V_B$) of the circuit. Further, a voltage drop associated with two distinct nodes of a circuit may be defined by respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for a read out of a field effect transistor based memory cell, the gate-source voltage drop and the gate-source voltage, $V_{GS}$, may be referred to as gate voltage.

In some aspects, two voltages may be compared with one another by relative terms such as "greater", "less", or "equal", for example. It is understood that, in some aspects, a comparison may include the sign (positive or negative) of the voltage value or, in other aspects, the absolute voltage values (also referred to as the magnitude) are considered for the comparison. As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor-based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as ID) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 μA. In some aspects, the constant-current threshold voltage, $V_{th(ci)}$, may be determined based on the following equation:

$$V_{th(ci)} = V_{GS}(\text{at } I_D = I_{D0} \cdot W/L).$$

A threshold voltage of a field-effect transistor or a field-effect transistor based memory cell may be defined by the properties of the field-effect transistor or of the field-effect transistor based memory cell (e.g. the materials, the doping, etc.), and it may thus be a (e.g. intrinsic) property of the field-effect transistor or of the field-effect transistor based memory cell.

According to various aspects, a memory cell may have at least two distinct states, e.g. with two distinct electrical conductivities that can be determined to determine in which of the at least two distinct states the memory cell is residing in. A FET based memory cell (for example a remanent-polarizable memory cell) may include a first memory state, e.g. a low threshold voltage state (referred to as LVT state), and a second memory state, e.g. a high threshold voltage state (referred to as HVT state). The high threshold voltage state may be, in some aspects, associated with a lower current flow during readout than the low threshold voltage state. The low threshold voltage state may be an electrically conducting state (e.g. associated with a logic "1") and the high threshold voltage state may be an electrically non-conducting (or at least less conducting) state (e.g. associated with a logic "0"). However, the definition of the LVT state and the HVT state and/or the definition of a logic "0" and a logic "1" may be selected arbitrarily.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor (FET) structure having a ferroelectric material as a gate insulator. As another example, a memory cell may include a field-effect transistor structure and a ferroelectric capacitor structure coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; and, therefore, it may be used to turn the field-effect transistor into a non-volatile field-effect transistor based memory structure.

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various different integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include a plurality of (e.g. two) FeFET structures. This may allow for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET based memory cells on a CMOS process platform may be carried out in a gate-first process technology. However, FeFET based memory cells may be implemented into other process technologies, wherein different integration schemes may be used. The FeFET based memory cells may be integrated, for example, next to one or more logic circuit structures, e.g., next to one or more processor cores on a chip. However, the FeFET based memory cells may be integrated independently from other structures. According to various aspects, a FeFET memory cell or a FeFET based memory cell may be provided with a feature size equal to or less than about 45 nm.

According to various aspects, a ferroelectric material may be used as part of a memory cell. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various aspects may be related to a remanently-polarizable layer as memory layer or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, the terms "spontaneously polarized" or "spontaneous polarization" may be used with reference to the polarization capability of a material beyond dielectric polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

In general, a memory cell arrangement (e.g. an array including a plurality of memory cells) may be operated based on one or more write operations (e.g. program and/or erase operations) and/or one or more readout operations. During a write operation, as example, predefined voltages may be applied at electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. In other words, all memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g. to provide the desired write voltages and/or the desired readout voltages.

In general, a memory cell arrangement may include a plurality of (e.g. volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g. to a word-line, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g. source and drain regions are shared by neighboring transistors), and the string is connected to a bit-line and a source-line, i.e. groups of memory cells in aNAND architecture may be connected in series with one another. In a NOR architecture the memory cells may be connected in parallel with one another, i.e. each memory cell of a column may be connected to a different source-line and shares the same bit-line with the one or more other memory cells in the same column. A NAND architecture may thus be more suited for serial access to data stored in the memory cells, whereas a NOR architecture may be more suited for random access to data stored in the memory cells. A possible issue may be that during a readout operation an undesired current flow may be generated through one or more memory cells that are not intended to be read out, so that such current flow may disturb the signal (e.g. a readout current) generated by the memory cells that are actually intended to be read out.

Various aspects are related to a memory cell arrangement including a plurality of memory cells, e.g. a plurality of FET based memory cells. As an example, a control circuit may be configured to carry out and/or instruct one or more readout operations associated with a readout of one or more memory cells of the memory cell arrangement. In some aspects, a control circuit may be used to control a readout of a single memory cell of the memory cell arrangement that is intended to be read out, wherein the rest of the memory cells of the memory cell arrangement are not read out and not intended to be read out.

Various aspects are related to a control circuit that is configured to efficiently carry out readout operations based on a pre-defined readout scheme. The pre-defined readout scheme may illustratively include providing various voltages to the memory cells in such a way that only the one or more memory cell of the memory cell arrangement that are intended to be read out are actually read out. In particular, the readout scheme described herein may include providing various voltages to the memory cells such that the memory cells not to be read out do not generate a substantial leakage current during the readout of the one or more memory cells to be read out. Further, the readout scheme described herein may include providing various voltages to the memory cells such that the memory cells not to be read out do not disturb the readout of the one or more memory cells to be read out.

According to various aspects, a memory cell arrangement may include a plurality of memory cells. Each of the memory cells may include a field-effect transistor (FET) structure. As an example, each of the memory cells may include at least a second terminal, a third terminal, and a first terminal to control an electrical behavior of the second terminal and the third terminal of the memory cell. In some aspects, the first terminal may be referred to as a gate terminal (or gate node) and a voltage may be provided to the first terminal via a first control-line (also referred to as word-line). The second terminal may be referred to as a source terminal (or source node) and a voltage may be provided to the second terminal via a second control-line (also referred to as source-line). The third terminal may be referred to as a drain terminal (or drain node) and a voltage may be provided to the third terminal via a third control-line (also referred to as bit-line).

According to various aspects, a memory cell arrangement may include one or more first subsets of memory cells, wherein the memory cells of each first subset may be addressed by a corresponding (e.g. common) source/bit-line pair, wherein a source-line may connect the respective source terminals of the memory cells of the respective first subset with one another and a bit-line may connect the respective drain terminals of the memory cells of the respective first subset with one another. In other words, the memory cell of each of the one or more first subsets of memory cells may be connected to a common source-line and a common bit-line. The memory cell arrangement may include second subsets of memory cells, wherein the memory cells of each second subset may be addressed by a corresponding (e.g. common) word-line, wherein the word-line may connect the respective gate terminals of the memory cells of the second subset with one another. In other words, the memory cells of each of the second subsets of memory cells may be connected to a common word-line. Illustratively, each of the one or more memory cells of a first subset may be connected to a corresponding one of respective one or more word-lines, and each of the one or more memory cells of a second subset may be connected to a corresponding one of respective one or more source/bit-line pairs.

According to various aspects, one or more of the memory cells of such a memory cell arrangement may be selected to be read out by applying a select voltage (referred to as $V_{sel}$) to a word-line corresponding to the second subset including the one or more memory cells to be read out, and a base voltage, $V_B$, or a voltage close to the base voltage (e.g. in the range from about −0.25 V to about +0.25 V if the base voltage is 0 V) to the rest of the word-lines corresponding to the rest of the second subsets. Further, one or more readout voltage pairs may be provided to the one or more source/bit-line pairs corresponding to the one or more first subsets including the one or more memory cells to be read out, and the base voltage, $V_B$, or a voltage close to the base voltage (e.g. in the range from about −0.25 V to about +0.25 V if the base voltage is 0 V) may be provided to the rest of the source/bit-line pairs corresponding to the rest of the first subsets. The one or more readout voltage pairs may include each a first read out voltage (referred to as $V_{R,D}$) that may be provided to the bit-line of the source/bit-line pair and a second readout voltage (referred to as $V_{R,S}$) that may be provided to the source-line of the source/bit-line pair. According to various aspects, both readout voltages of a readout voltage pair may be provided such that they are distinct from one another to allow a readout current flow between the source-line and the bit-line of the corresponding source/bit-line pair depending on the memory state of the selected memory cell to be read out. Further, according to various aspects, both readout voltages of a readout voltage pair may be provided with an offset to the base voltage, $V_B$. Therefore, on the one hand, a current flow may occur in the one or more memory cells to be read out depending on the respective memory state and on the other hand, due to the offset, a voltage drop between the gate terminal and the source/drain terminals of the other memory cells of the corresponding first subsets can be influenced. This may ensure that the memory cells of the corresponding first subsets not to be read out provide no substantial current flow between the corresponding source-line and bit-line independently of their memory state. Since the effective control voltage (e.g. a voltage between the gate terminal and the source/drain terminals) of these memory cells may be influenced by the offset, the respective memory cells not to be read out may be kept in or brought into a non-conductive state (e.g. not electrically connecting the source-line and the bit-line with one another) independently of their memory state.

According to various aspects, a memory cell arrangement may include a plurality of memory cells including one or more first subsets of memory cells and second subsets of memory cells. The memory cell arrangement may include a control circuit to read out a memory cell to be read out, the memory cell to be read out may be included in one of the one or more first subsets and in one of the second subsets, wherein the first subset may further include one or more memory cells not to be read out. The control circuit may have a base voltage, V, associated therewith and may be configured to: provide a first gate-source voltage, $V_{GS-1}$, to the memory cell to be read out by supplying a source voltage, $V_S$, and a first gate voltage, $V_{G-1}$, to the corresponding source-line and word-line, respectively; and provide a second gate-source voltage, $V_{GS-2}$, to the one or more memory cells not to be read out by supplying a second gate voltage, $V_{G-2}$, different from the first gate voltage, $V_{G-1}$, to the corresponding one or more word-lines. The source voltage, $V_S$, may have an offset to the base voltage, V, such that a source/drain current flow through the memory cell to be read out is a function of a memory state the memory cell to be read out is residing in, and such that a source/drain current flow through each of the one or more memory cells not to be read out is prevented independently from a memory state the respective memory cell not to be read out is residing in.

According to various aspects, the control circuit may be further configured to provide a third gate-source voltage, $V_{GS-3}$, to one or more memory cells not to be read out which are in a same second subset as the memory cell to be read out by supplying a voltage that is substantially the base voltage, $V_B$, to the corresponding one or more source-lines. According to various aspects, the control circuit may be further configured to supply a voltage that is substantially the base voltage, V, to one or more bit-lines corresponding to the one or more memory cells not to be read out which are in the same second subset as the memory cell to be read out. According to various aspects, the control circuit may be further configured to provide a fourth gate-source voltage, $V_{GS-4}$, to one or more of the memory cells of the plurality of memory cells which are not in the same first subset as the memory cell to be read out and not in the same second subset as the memory cell to be read out, wherein the fourth gate-source voltage, $V_{GS-4}$, may be substantially zero (e.g. zero volts, 0 V). This may ensure that a source/drain current flow through each of the one or more memory cells not to be read out of the memory cell arrangement is prevented independently from a memory state the respective memory cell not to be read out is residing in.

According to various aspects, a memory cell arrangement may include: a plurality of memory cells including one or more memory cells to be read out and one or more memory cells not to be read out, a control circuit configured to read out the one or more memory cells to be read out. The control circuit may define a base voltage, V, and may be configured to: supply a select voltage, $V_{sel}$, to a word-line corresponding to the one or more memory cells to be read out; supply a first readout voltage, $V_{R,D}$, and a second readout voltage, $V_{R,S}$, to each of one or more source/bit-line pairs corresponding to the one or more memory cells to be read out; and supply a voltage that is substantially the base voltage, $V_B$, (e.g. in the range from about –0.25 V to about +0.25 V if the base voltage is 0 V) to one or more word-lines corresponding to the one or more memory cells not to be read out. According to various aspects, both the first readout voltage, $V_{R,D}$, and the second readout voltage, $V_{R,S}$, may be provided with an offset to the base voltage, $V_B$, to prevent a current flow through the one or more memory cells not to be read out, and the first readout voltage, $V_{R,D}$, and the second readout voltage, $V_{R,S}$, may be different from one another to allow for a readout current flow representing a respective memory state of the one or more memory cells to be read out. Further, a voltage that is substantially the base voltage, V, (e.g. a voltage in the range from about –0.25 V to about +0.25 V if the base voltage is 0 V) may be supplied to each of one or more source/bit line pairs not corresponding to the one or more memory cells to be read out.

According to various aspects, a memory cell arrangement may include: a plurality of memory cells, a set of source/bit-line pairs, each source/bit-line pair of the set of source/bit-line pairs coupled to a first subset of the plurality of memory cells, a set of word-lines, each word-line of the set of word-lines coupled to a second subset of the plurality of memory cells, a control circuit configured to read out one or more memory cells of the plurality of memory cells (illustratively, one or more memory cells of a second subset). The control circuit may be configured to: supply a first word-line voltage (referred to as $V_{WL-1}$) to a word-line of the set of word-lines corresponding to the one or more memory cells to be read out; supply a second word-line voltage (referred to as $V_{WL-2}$) to each word-line of the set of word-lines not corresponding to the one or more memory cells to be read out, wherein the second word-line voltage, $V_{WL-2}$, may be in the range from a base voltage, $V_B$, of the control circuit to the first word-line voltage, $V_{WL-1}$; supply a readout voltage pair to each source/bit-line pair of the set of source/bit-line pairs corresponding to the one or more memory cells to be read out. According to various aspects, both a first readout voltage, $V_{R,D}$, and a second readout voltage, $V_{R,S}$, of each readout voltage pair may have an offset to the second word-line voltage, $V_{WL-2}$ to prevent a current flow through all memory cells of the respective first subset not to be read out, and the first readout voltage, $V_{R,D}$, and the second readout voltage, $V_{R,S}$, may be different from one another to allow for a readout current flow representing a memory state of the memory cell of the respective first subset to be read out. Further, a first source/drain voltage, $V_D$, and a second source/drain voltage, $V_S$, may be supplied to the one or more source/bit-line pairs not corresponding to the one or more memory cells to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about –0.25 V to about +0.25 V if the base voltage is 0 V.

According to various aspects a memory cell arrangement may include: a plurality of memory cells, each of the memory cells may have a first threshold voltage, $V_{L-th}$, and a second threshold voltage, $V_{H-th}$, as a function of a memory state the memory cell is residing in, a set of source/bit-line pairs, each source/bit-line pair of the set of source/bit-line pairs coupled to a first subset of the plurality of memory cells, a set of word-lines, each word-line of the set of word-lines coupled to a second subset of the plurality of memory cells, a control circuit configured to read out one or more memory cell of the plurality of memory cells (illustratively, one or more memory cells of a second subset). The control circuit may be configured to: supply a first word-line voltage, $V_{WL-1}$, to a word-line of the set of word-lines corresponding to the one or more memory cells to be read out; supply a second word-line voltage, $V_{WL-2}$, to one or more word-lines of the set of word-lines not corresponding to the one or more memory cells to be read out, wherein the second word-line voltage is between the first threshold voltage, $V_{L-th}$, and the second threshold voltage, $V_{H-th}$; supply a first readout voltage, $V_{R,D}$, and a second readout voltage, $V_{R,S}$, to each of the one or more source/bit-line pairs coupled to the one or more memory cells to be read-out. According to various aspects, both the first readout voltage $V_{R,D}$, and the second readout voltage, $V_{R,S}$, may have a voltage offset to the second word-line voltage, $V_{WL-2}$, to prevent a current flow through one or more memory cells of the respective first subset not to be read out, and the first readout voltage $V_{R,D}$, and the second readout voltage $V_{R,S}$, may be different from one another to allow for a readout current flow representing a memory state of the memory cell of the respective first subset to be read out. The absolute value of the voltage offset may be greater than the voltage difference between the second word-line voltage, $V_{WL-2}$, and the first threshold voltage, $V_{L-th}$. According to various aspects, the voltage offset may be positive in the case that the first threshold voltage, $V_{L-th}$, is negative, and the voltage offset may be negative in the case that the first threshold voltage, $V_{L-th}$, is positive. According to various aspects, the voltage offset may be positive in the case that each of the memory cells is a p-type memory cell, and the voltage offset may be negative in the case that each of the memory cells is an n-type memory cell. Further, a first source/drain voltage, $V_D$, and a second source/drain voltage, $V_S$, may be supplied to the one or more source/bit-line pairs not corresponding to the one or more memory cells to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

According to various aspects, a method for operating a memory cell arrangement may include: applying a select voltage, $V_{sel}$, to a word-line corresponding to one or more memory cells to be read out; applying a first readout voltage, $V_{R,D}$, and a second readout voltage, $V_{R,S}$, to each of one or more source/bit-line pairs corresponding to the one or more memory cells to be read out; and applying a voltage that is substantially a base voltage, $V_B$, (e.g. in the range from about −0.25 V to about +0.25 V if the base voltage is 0 V) to one or more word-lines not corresponding to one or more memory cells to be read out. According to various aspects, both the first readout voltage, $V_{R,D}$, and the second readout voltage, $V_{R,S}$, may be provided with an offset to the base voltage, $V_B$, to prevent a current flow through one or more memory cells not to be read out, and the first readout voltage, $V_{R,D}$, and the second readout voltage, $V_{R,S}$, may be different from one another to allow for a readout current flow representing a memory state of the corresponding memory cell to be read out. Further, a first source/drain voltage, $V_D$, and a second source/drain voltage, $V_S$, may be supplied to the one or more source/bit-line pairs not corresponding to the one or more memory cells to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

According to various aspects, it may be energy efficient to apply the base voltage, $V_B$, or a voltage close to the base voltage (e.g. in the range from about −0.25 V to about +0.25 V if the base voltage is 0 V) to as many control-lines as possible during the readout. In some aspects, the voltage applied to the word-lines corresponding to the non-selected memory cells (illustratively, the memory cells not to be read out) may be higher than the low threshold voltage, $V_{L-th}$, of the memory cells, e.g. in the case that the low threshold voltage, $V_{L-th}$, is a negative voltage the voltage applied to the word lines may be 0 V or at least higher (illustratively more positive) than the negative low threshold voltage, $V_{L-th}$. However, to prevent a substantial current flow through the non-selected memory cells of a first subset of memory cells including at least a memory cell to be read out, the corresponding source voltage, $V_S$, e.g. the corresponding voltage provided to the source-line of the respective source/bit-line pair, is increased to effectively generate a voltage drop, $V_{GS}$, over the gate structure of the non-selected memory cells that is lower than the low threshold voltage, $V_{L-th}$, and a voltage drop, $V_{GS}$, over the gate structure of the selected memory cells that is higher than the low threshold voltage, $V_{L-th}$.

FIG. 1A illustrates schematically an exemplary configuration of a memory cell arrangement 100, according to various aspects. The memory cell arrangement 100 may include a plurality of memory cells 102. The memory cells 102 may be, for example, arranged in a matrix architecture, e.g. the memory cells 102 may be arranged in a number, n, of columns and in a number, m, of rows, with m and n integer numbers greater than 1. FIG. 1A illustrates three columns (e.g. a first column, a second column, and an n-th column) and three rows (a first row, a second row, and an m-th row) of a memory cell arrangement 100 including three memory cells 102 each, only as an example. The memory cell arrangement 100 may include any suitable number of memory cells 102, arranged in any suitable number, n, of columns and in any suitable number, m, of rows.

According to various aspects, the memory cell arrangement 100 may include a plurality of control-lines (e.g. one or more word-lines, WL, one or more bit-lines, BL, and one or more source-lines, SL), coupled to the memory cells 102. The control-lines may be used to supply voltages to control nodes of the memory cells 102. The plurality of control-lines may be provided in any suitable way defined by the desired matrix architecture of the memory cell arrangement 100, and may define subsets of memory cells 102.

According to various aspects, the memory cell arrangement 100 may include a set of source/bit-line pairs (e.g. each source/bit-line pair including a corresponding source-line, SL, and a corresponding bit-line, BL), each source/bit-line pair of the set of source/bit-line pairs coupled to a respective first subset of the plurality of memory cells 102. In the exemplary configuration illustrated in FIG. 1A, the source/bit-line pair including the first source-line, SL(1), and the first bit-line, BL(2), may be coupled to the memory cells 102 in the first column of memory cells 102 (e.g. the memory cell 102 in the position (1,1), the memory cell 102 in the position (2,1), . . . , and the memory cell 102 in the position (m,1)); the source/bit-line pair including the second source-line, SL(2), and the second bit-line, BL(1), may be coupled to the memory cells 102 in the second column of memory cells 102 (e.g. the memory cell 102 in the position (1,2), the memory cell 102 in the position (2,2), . . . , and the memory cell 102 in the position (m,2)); and the source/bit-line pair including the n-th source-line, SL(n), and the n-th bit-line, BL(n), may be coupled to the memory cells 102 in the n-th column of memory cells 102 (e.g. the memory cell 102 in the position (1,n), the memory cell 102 in the position (2,n), . . . , and the memory cell 102 in the position (m,n)). The memory cell arrangement 100 may include any suitable number of source/bit-line pairs, wherein each source/bit-line pair may be coupled to a respective first subset of the plurality of memory cells 102. In other words, each source/bit-line pair of the set of source/bit-line pairs may define a first subset of memory cells 102, wherein each memory cell 102 in a first subset of memory cells 102 (e.g. each memory cell 102 in a same column) may be coupled to the respective source/bit-line pair.

According to various aspects, the memory cell arrangement 100 may include a set of word-lines, (e.g. a first word-line, WL(1), a second word-line, WL(2), . . . , an m-th word-line, WL(m)). Each word-line, WL, of the set of word-lines may be coupled to a memory cell 102 of a second subset of memory cells 102. In the exemplary configuration illustrated in FIG. 1A, the first word-line, WL(1), may be coupled to the memory cells 102 in the first row of memory cells 102 (e.g. the memory cell 102 in the position (1,1), the memory cell 102 in the position (1,2), . . . , and the memory cell 102 in the position (1,n)); the second word-line, WL(2), may be coupled to the memory cells 102 in the second row of memory cells 102 (e.g. the memory cell 102 in the position (2,1), the memory cell 102 in the position (2,2), . . . , and the memory cell 102 in the position (2,n)); the m-th word-line, WL(m), may be coupled to the memory cells 102 in the m-th row of memory cells 102 (e.g. the memory cell 102 in the position (m,1), the memory cell 102 in the position (m,2), . . . , and the memory cell 102 in the position (m,n)). The memory cell arrangement 100 may include any suitable number of word-lines, wherein each word-line may be coupled to a respective second subset of the plurality of memory cells 102. In other words, each word-line of the set of word-lines may define a second subset of memory cells 102, wherein each memory cell 102 in a second subset of memory cells 102 (e.g. each memory cell 102 in a same row) may be coupled to the respective word-line.

According to various aspects, each memory cell 102 of the plurality of memory cells 102 may be a field-effect transistor (FET) based memory cell, and may include two source/drain regions and a gate region to control a current flow between the two source/drain region. According to various aspects, each memory cell 102 may include a first control node 102w (also referred to as gate node, e.g. coupled to the gate region of the memory cell 102), a second control node 102s (also referred to as source node, e.g. coupled to the source region of the memory cell 102), and a third control node 102d (also referred to as drain node, e.g. coupled to the drain region of the memory cell 102). For example, the gate node 102w of each memory cell 102 may be connected to a corresponding word-line, WL, the source node 102s of each memory cell 102 may be connected to a source-line, SL, of the corresponding source/bit-line pair, and the drain node 102d of each memory cell 102 may be connected to a bit-line, BL, of the corresponding source/bit-line pair. In other words, each memory cell 102 of the plurality of memory cells 102 may be unambiguously assigned to one word-line WL and to one source/bit-line pair.

According to various aspects, each memory cell 102 of the plurality of memory cells 102 may be configured to be in a plurality of memory states. Each memory cell 102 may have either a first (e.g. low) threshold voltage, $V_{L-th}$, or a second (e.g. high) threshold voltage, $V_{H-th}$, as a function of the memory state the memory cell 102 is residing in. As an example, the plurality of memory states may include a first memory state (e.g. a LVT state) and a second memory state (e.g. a HVT state), and each memory cell 102 may have a first (e.g. low) threshold voltage, $V_{L-th}$, in the first memory state, and a second (e.g. high) threshold voltage, $V_{H-th}$, in the second memory state. The first threshold voltage, $V_{L-th}$, may be different (e.g. lower) from the second threshold voltage, $V_{H-th}$. Therefore, the memory state, in which the respective memory cell 102 is residing in, may be determined by determining whether the memory cell 102 has the first threshold voltage, $V_{L-th}$, or the second threshold voltage, $V_{H-th}$. The determination of the memory state may be referred to as a readout or a readout operation. The memory states and the threshold voltages of a memory cell will be explained in further detail below, for example in relation to FIG. 2A.

In the following, a read out of a memory cell 102 is described in more detail. Only as an example, the memory cell 102 to be read out may be the memory cell 102 in position (2,n). The memory cell 102 to be read out may correspond to one of the first subsets (e.g. to the n-th column of memory cells 102) and one of the second subsets (e.g. to the second row of memory cells 102). In this exemplary case, the first subset may be defined by the n-th source-line, SL(n), and by the n-th bit-line, BL(n), e.g. by the n-th source/bit-line pair. The rest of the memory cells 102 of this first subset (e.g. in the exemplary configuration of FIG. 1A, the memory cell 102 at position (1,n), and the memory cell 102 at position (m,n)) are not to be read out. In this exemplary case, the second subset may be defined by the second word-line, WL(2). In some aspects, only one memory cell 102 of the second subset (in this exemplary case the memory cell 102 at position (2,n)) is read out. However, more than one or all memory cells 102 of this second subset (e.g. in the exemplary configuration of FIG. 1A, the memory cell 102 at position (2,1), and the memory cell 102 at position (2,2)) may be read out at the same time (e.g. by a single readout operation) since they may be individually addressable for the readout via the corresponding source/bit-line pair.

According to various aspects, the memory cell arrangement 100 may include a control circuit 110, which may be configured to carry out and/or instruct one or more readout operations associated with a readout of the memory cells 102 of the memory cell arrangement 100. Illustratively, at least one memory cell 102 may be intended to be read out (also referred to as selected memory cell, e.g. the memory cell 102 at position (2,n) in FIG. 1A), and one or more memory cells 102 may be intended not to be read out (also referred to as non-selected memory cells). As an example, the control circuit 110 may include or may control one or more voltage supply circuits, which may be used for supplying control voltages to the control-lines (e.g. to the set of word-lines, WL, and to the set of source/bit-line pairs, SL, BL) of the memory cell arrangement 100, e.g. for supplying voltages to the respective control nodes of the selected memory cell 102 and of the one or more non-selected memory cells 102. According to various aspects, the control circuit 110 may define a base voltage, $V_B$, e.g. a base voltage (for example 0 V) for the memory cell arrangement 100.

According to various aspects, the control circuit 110 may be configured to supply a first word-line voltage, $V_{WL-1}$, (e.g. a select voltage, $V_{sel}$) to a word-line, WL, of the set of word-lines corresponding to the memory cell 102 to be read out (in this exemplary case, to the second word-line, WL(2)). In other words, the control circuit 110 may be configured to provide a first gate voltage, $V_{G-1}$, to the memory cell 102 to be read out. Illustratively, the first gate voltage, $V_{G-1}$, is also provided to the other memory cells 102 in the same second subset of the memory cell 102 to be read out, e.g. to the other memory cells 102 connected to the same word-line as the memory cell 102 to be read out (in this exemplary case, to the second word-line, WL(2)).

According to various aspects, the control circuit 110 may be configured to supply a second word-line voltage, $V_{WL-2}$, to one or more word-lines, WL, of the set of word-lines corresponding to one or more memory cells 102 not to be read out (in this exemplary case, to the first word-line, WL(1), and to the m-th word-line, WL(m)). In other words, the control circuit 110 may be configured to provide a second gate voltage, $V_{G-2}$, different from the first gate voltage, $V_{G-1}$, to the one or more memory cells 102 not to be read out that are not in the second subset of the memory cell 102 to be read out. According to various aspects, the second word-line voltage, $V_{WL-2}$, may be in the range from the base voltage, $V_B$, of the control circuit 110 to the first word-line voltage, $V_{WL-1}$, e.g. the second word-line voltage, $V_{WL-2}$, may be substantially the base voltage, V, (e.g. in the range from about −0.25 V to about +0.25 V if the base voltage is 0 V). According to various aspects, the second word-line voltage, $V_{WL-2}$, may be between the first threshold voltage, $V_{L-th}$, and the second threshold voltage, $V_{H-th}$.

According to various aspects, the control circuit 110 may be configured to supply a first readout voltage, $V_{R,D}$, and a second readout voltage, $V_{R,S}$, to a source/bit-line pair corresponding to the memory cell 102 to be read out, e.g. it may be configured to supply a first readout voltage, $V_{R,D}$, and a second readout voltage, $V_{R,S}$, to the source/bit-line pair coupled to the first subset of memory cells 102 including the memory cell 102 to be read out (in this exemplary case, to the n-th source line, SL(n), and to the n-th bit-line, BL(n)). In other words, the control circuit 110 may be configured to provide a source voltage, $V_S$, and a drain voltage, $V_D$, to the memory cells 102 of the first subset including the memory cell 102 to be read out.

According to various aspects, the control circuit 110 may be configured to supply a first source/drain voltage, $V_D$, and a second source/drain voltage, $V_S$, to the one or more source/bit-line pairs not corresponding to the memory cell 102 to be read out (in this exemplary case, the first source/drain voltage, $V_D$, and the second source/drain voltage, $V_S$, may be provided to the first source-line, SL(1), the first bit-line, BL(1), the second source-line, SL(2), and the second bit-line, BL(2)). The first source/drain voltage, $V_D$, may be equal to the second source/drain voltage, $V_S$, since the memory cells 102 of the corresponding first subsets are not intended to be read out.

The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V. In some aspects, the control circuit 110 may be configured to supply the base voltage, $V_B$, or a voltage close to the base voltage to each source/bit-line pair that is not coupled to the first subset of memory cells 102 including the memory cell 102 to be read out.

According to various aspects, the control circuit 110 may be configured to provide a first gate-source voltage, $V_{GS-1}$, to the memory cell 102 to be read out (in this exemplary case the memory cell 102 at position (2,n)) by supplying the source voltage, $V_S$, and the first gate voltage, $V_{G-1}$, to the corresponding source-line and word-line, respectively (in this exemplary case to the source-line SL(n) and to the word-line WL(2)); provide a second gate-source voltage, $V_{GS-2}$, to the one or more memory cells 102 not to be read out (in this exemplary case, the memory cell 102 at position (1,n), and the memory cell 102 at position (m,n)) by supplying the second gate voltage, $V_{G-2}$, to the corresponding one or more word-lines (in this exemplary case the word-line WL(1) and the word-line WL(m)). This may ensure that a source/drain current flow through the memory cell 102 to be read out may be a function of a memory state the memory cell 102 to be read out is residing in, and a source/drain current flow through each of the one or more memory cells 102 not to be read out may be prevented independently from a memory state the respective memory cell 102 not to be read out is residing in.

According to various aspects, the control circuit 110 may further be configured to provide a third gate-source voltage, $V_{GS-3}$, to one or more memory cells 102 not to be read out which are in the same second subset as the memory cell 102 to be read out (in this exemplary case the memory cells 102 at positions (2,1) and (2,2), which are in the same second subset as the memory cell 102 (2,n), which is intended to be read out), by supplying a voltage that is substantially the base voltage, $V_B$, to the corresponding one or more source-lines (in this exemplary case the source-line SL(1) and the source-line SL (2)). According to various aspects, the control circuit 110 may further be configured to supply a voltage that is substantially the base voltage, $V_B$, to one or more bit-lines corresponding to the one or more memory cells 102 not to be read out which are in the same second subset as the memory cell 102 to be read out (in this exemplary case the bit-line BL(1) and the bit-line BL (2)). According to various aspects, the control circuit 110 may further be configured to supply a fourth gate-source voltage, $V_{GS-4}$, which is substantially zero (e.g. substantially zero volts, 0 volts), to the rest of the memory cells 102 (in this exemplary case, the memory cell 102 at position (1,1), the memory cell 102 at position (1,2), the memory cell 102 at position (m,1), and the memory cell 102 at position (m,2)), e.g. to the one or more of the memory cells 102 of the plurality of memory cells 102 which are not in the same first subset as the memory cell 102 to be read out and not in the same second subset as the memory cell 102 to be read out.

According to various aspects, both the first readout voltage, $V_{R,D}$, and the second readout voltage, $V_{R,S}$, may be provided in such a way that they have an predefined offset to the second word-line voltage, $V_{WL-2}$, to prevent a current flow through the one or more memory cells 102 not to be read out (illustratively, through the one or more memory cells 102 not to be read out in the first subset including the memory cell 102 to be read out). In other words, both the first readout voltage, $V_{R,D}$, and the second readout voltage, $V_{R,S}$, may be different from the second word-line voltage, $V_{WL-2}$. According to various aspects the first readout voltage, $V_{R,D}$, and the second readout voltage, $V_{R,S}$, may be different from one another to allow for a readout current flow representing a memory state of the memory cell 102 to be read out. In other words, the magnitude of both the first readout voltage, $V_{R,D}$, and of the second readout voltage, $V_{R,S}$, may be greater than the second word-line voltage, $V_{WL-2}$, (e.g. greater than the base voltage, $V_B$, in some aspects) and the first readout voltage, $V_{R,D}$, and the second readout voltage, $V_{R,S}$, may be different from one another. Illustratively, the source-voltage, $V_S$, provided to the memory cells 102 of the first subset including the memory cell 102 to be read out may be provided with an offset to the base voltage, $V_B$, (e.g. with an offset to zero volts) such that a source/drain current flow through the memory cell 102 to be read out is a function of a memory state the memory cell 102 to be read out is residing in, and such that a source/drain current flow through each of the one or more memory cells 102 not to be read out of this first subset is prevented independently from a memory state the respective memory cell 102 not to be read out is residing in.

In this configuration, there may be a potential difference between the bit-line, BL, and the source-line, SL, corresponding to the first subset including the memory cell 102 to be read out, such that current can flow between the respective source node 102s and drain node 102d of the memory cell 102 to be read out. Furthermore, the lowest voltage the bit-line, BL, and the source-line, SL, may be selected so as to reduce cumulative current flow from the one or memory cells 102 not to be read out of this first subset to such a degree that the actual readout current of the selected memory cell 102 is not disturbed, e.g. it may be selected so that no (e.g. substantial) current flow occurs in the memory cells 102 not to be read out of this first subset (e.g. the current flow in those memory cells 102 may be lower than 10 nA or lower than 1 nA). In addition, since only two control-lines, e.g. the bit-line, BL, and the source-line, SL, corresponding to the first subset including the memory cell 102 to be read out should be raised to the first readout voltage, $V_{R,D}$, and to the second readout voltage, $V_{R,S}$, respectively, the power consumption may be kept at a low level.

According to various aspects, the absolute value of the voltage offset may be greater than the voltage difference between the second word-line voltage, $V_{WL-2}$, and the first threshold voltage, $V_{L-th}$, so that the gate-source voltage, $V_{GS}$, in the memory cells 102 not to be read out (illustratively the memory cells 102 not to be read out in the first subset including the memory cell 102 to be read out) is lower than the first threshold voltage, $V_{L-th}$, and a substantial current flow in those memory cells 102 may be prevented. According to various aspects, the voltage offset may be positive in the case that the first threshold voltage, $V_{L-th}$, is negative, and the voltage offset may be negative in the case that the first threshold voltage, $V_{L-th}$, is positive. According to various aspects, the voltage offset may be positive in the case that each of the memory cells 102 is a p-type memory cell, and the voltage offset may be negative in the case that each of the memory cells 102 is an n-type memory cell.

According to various aspects, a voltage difference between the first word-line voltage, $V_{WL-1}$, and the first readout voltage, $V_{R,D}$, may be greater than the first threshold voltage, $V_{L-th}$, and/or a voltage difference between the first word-line voltage, $V_{WL-1}$, and the second readout voltage, $V_{R,S}$, may be greater than the first threshold voltage, $V_{L-th}$, so that the gate-source voltage, $V_{GS}$, in the memory cell 102 to be read out is greater than the first threshold voltage, $V_{L-th}$, and a substantial current flow in such memory cell 102 may be allowed. According to various aspects, a voltage difference between the first word-line voltage, $V_{WL-1}$, and the first readout voltage, $V_{R,D}$, and/or the second readout voltage, $V_{R,S}$, may be smaller than the second threshold voltage, $V_{H-th}$. As a numerical example, the first word-line voltage, $V_{WL-1}$, may be in a range from 0.1 V to 5 V, for example it may be 1V; the first readout voltage, $V_{R,D}$, may be in a range from 0.2 V to 5.5V, for example it may be 0.5 V; and the second readout voltage, $V_{R,S}$, may be in a range from 0.1 V to 5 V, for example it may be 0.4V.

According to various aspects, a voltage difference between the second word-line voltage, $V_{WL-2}$, and the first threshold voltage, $V_{L-th}$, of the memory cells 102 (e.g. a voltage difference between the base voltage, $V_B$, and the first threshold voltage, $V_{L-th}$, of the memory cells 102) may be less than about 5 V, for example less than about 2 V, for example in a range from −2 V to 2 V or in a range from about −1 V to about 1 V. In some configurations, the second word-line voltage, $V_{WL-2}$, (e.g. the base voltage V) may be lower than the first threshold voltage, $V_{L-th}$, and in some configurations, the second word-line voltage, $V_{WL-2}$, may be higher than the first threshold voltage $V_{L-th}$.

According to various aspects, the choice for the respective values of the first word-line voltage, $V_{WL-1}$, the second word-line voltage, $V_{WL-2}$, and the readout voltages, $V_{R,D}$, $V_{R,S}$, may depend on the type of memory cells 102 used, for example on the type of transistor that a memory cell 102 may include. According to various aspects, in the case that each memory cell 102 is a n-type field-effect transistor based memory cell, the voltages may be selected so that the first threshold voltage, $V_{L-th}$, may be lower than the first word-line voltage, $V_{WL-1}$, the second threshold voltage, $V_{H-th}$, may be higher than the first word-line voltage, $V_{WL-1}$, and both the first readout voltage, $V_{R,D}$, and the second readout voltage, $V_{R,S}$, may be higher than the first word-line voltage, $V_{WL-1}$. In this configuration, the second word-line voltage, $V_{WL-2}$, may be higher than the first word-line voltage, $V_{WL-1}$. According to various aspects, in the case that each memory cell 102 is a p-type field-effect transistor based memory cell, the voltages may be selected so that the first threshold voltage, $V_{L-th}$, may be higher than the first word-line voltage, $V_{WL-1}$, the second threshold voltage, $V_{H-th}$, may be lower than the first word-line voltage, $V_{WL-1}$, and both the first readout voltage, $V_{R,D}$, and the second readout voltage, $V_{R,S}$, may be lower than the first word-line voltage, $V_{WL-1}$. In this configuration, the second word-line voltage, $V_{WL-2}$, may be lower than the first word-line voltage, $V_{WL-1}$.

As an example, the following voltages may be supplied to the control-lines of the memory cell arrangement 100 for reading out the memory cell 102 at the position (2, n). The control circuit 110 may be configured to raise the corresponding (e.g. selected) word-line, WL(2), to the first word-line voltage, $V_{WL-1}$, e.g. to supply the first word-line voltage, $V_{WL-1}$, to the word-line WL(2), for example 1 V. The control circuit 110 may be configured to raise the corresponding (e.g. selected) bit-line, BL(n), and source-line SL(n) to the first readout voltage, $V_{R,D}$, for example 0.5 V, and to the second readout voltage, $V_{R,S}$, for example 0.4 V, respectively. The control circuit 110 may be configured to supply the second word-line voltage, $V_{WL-2}$, for example 0 V, to the non-selected word-lines, e.g. the first word-line, WL(1), and m-th word-line, WL(m), and to the corresponding source-lines, SL, and bit-lines, BL, of the non-selected source/bit-line pairs, e.g. the first source-line, SL(1), the first bit-line, BL(1), the second source-line, SL(2), and the second bit-line, BL(2).

Figure 1B:
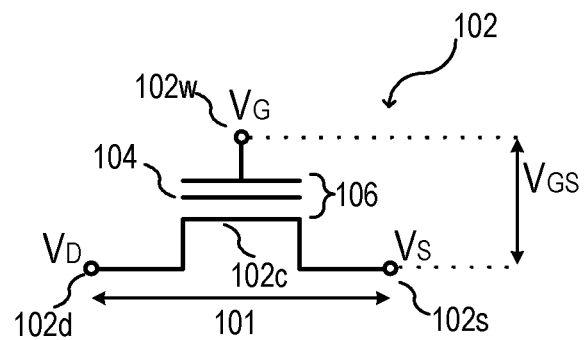
FIG. 1B and FIG. 1C schematically show a memory cell, according to various aspects.
Figure 1C:
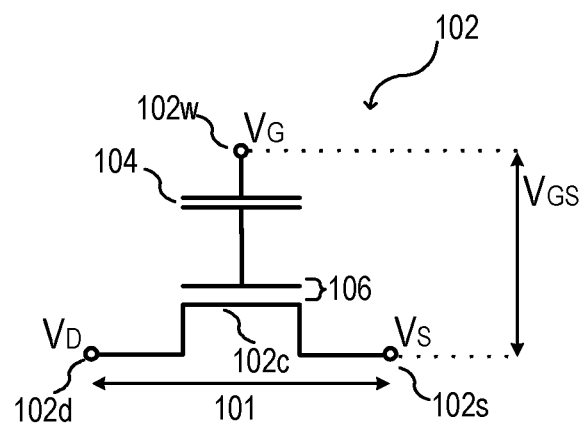

FIG. 1B and FIG. 1C illustrate two exemplary configurations of a memory cell 102 in a schematic view, according to various aspects. The memory cell 102 may be a field-effect transistor based memory cell, wherein one or more electronic properties of a field-effect transistor structure (e.g. a conductivity of a channel between two source/drain regions) may be influenced by a memory structure 104 (e.g. by a polarized ferroelectric material, a charged layer, etc.) of the memory cell 102.

According to various aspects, the memory cell 102 may be configured such that an electrical behavior of the source node 102s and the drain node 102d may be controlled via the gate node 102w. The electrical behavior of the source node 102s and the drain node 102d may include, for example, an electrical resistance associated with an electrical current flow 101 between the source node 102s and the drain node 102d. The electrical current flow 101 between the second control node 102s and the third control node 102d may be controlled by controlling the gate voltage, $V_G$, which is applied at the gate node 102w. Illustratively, the gate node 102w may be electrically connected to a gate structure 106 of the memory cell 102, and the gate structure 106 may be configured to allow a variation of the electrical conductivity of a channel formed between the source region and the drain region of the memory cell 102 by applying a voltage thereto.

According to various aspects, the memory cell 102 may include a memory structure 104, e.g. as part of the gate structure 106 (as shown, for example, in FIG. 1B) or connected to the gate structure 106 (as shown, for example, in FIG. 1C). According to various aspects, independently of a configuration of the memory structure 104 with respect to the gate structure 106, a gate-source voltage, $V_{GS}$, of the memory cell 102, e.g. in a memory cell arrangement 100, may be understood as the difference between the voltage (e.g. the potential) supplied to the word-line corresponding to the memory cell 102 and the voltage (e.g. the potential) supplied to the source-line corresponding to the memory cell 102. The memory structure 104 may be configured such that at least one electrical property (e.g. a charge state, a polarization, a conductivity, etc.) of the memory structure 104 can be changed persistently. According to various aspects, the memory structure 104 and the gate structure 106 may be configured to allow for a persistent change of the actual threshold voltage, $V_{th}$, of the memory cell 102 as a function of the state of the memory structure 104. Accordingly, the memory cell 102 may have at least a first memory state (e.g. the LVT memory state) and a second memory state (e.g. the HVT memory state) defined by the state of the memory structure 104. In the LVT memory state, the memory cell 102 may have a first threshold voltage, $V_{L-th}$, and in the HVT memory state, the memory cell 102 may have a second threshold voltage, $V_{H-th}$, as discussed above in relation, for example, to FIG. 1A. As an example, the memory structure 104 may be a floating gate, which may be in a first state when negative charges (i.e. electrons) are stored in the floating gate, and may be in a second state when the floating gate is uncharged. When negative charges are stored in the floating gate, a higher gate-source voltage, $V_{GS}$, is required to enable the current flow between the source and drain terminals of the memory cell, as compared to when the floating gate is uncharged, e.g. the memory cell may have a higher threshold voltage. Thus, switching the state of the floating gate from a charged state to an uncharged state, and vice versa, may allow switching the threshold voltage state of the memory cell, and accordingly a logic state associated therewith.

According to various aspects, the memory structure 104 may be a remanent-polarizable layer (e.g. a ferroelectric layer), e.g. the memory cell 102 may be a ferroelectric field-effect transistor (FeFET) memory cell or a ferroelectric field-effect transistor (FeFET) based memory cell. The remanent-polarizable layer may have two stable polarization states, and the memory cell may reside in a first memory state in the case that the remanent-polarizable layer is in a first polarization state, and the memory cell may reside in a second memory state in the case that the remanent-polarizable layer is in a second polarization state (e.g. opposite to the first polarization state). As an example (e.g. for an n-type doped substrate), in a first polarization state, there may be positive charges at the interface between the remanent-polarizable layer and an underlying stack formed by an insulating layer and the substrate (also referred to as the interface-semiconductor-stack, or IS-stack). In this configuration, for maintaining the charge neutrality of the stack, negative charges (electrons) may be attracted into the region of the substrate underneath the remanent-polarizable layer, e.g. in the channel of the FeFET, to compensate for the positive charges in the remanent-polarizable layer. The accumulation of negative charges may increase the conductivity of the channel, thus decreasing the threshold voltage of the memory cell. In a second polarization state, the polarization within the remanent-polarizable layer may be directed in the opposite (e.g. rotated by 180°) direction, so that there may be negative charges at the interface between the remanent-polarizable layer and the underlying IS-stack. In this case, compensating positive charges may be attracted into the channel of the FeFET, thus decreasing the conductivity of the channel and increasing the threshold voltage of the memory cell. Thus, switching the state of the remanent-polarizable layer from a first polarization state to a second polarization state, and vice versa, may allow switching the threshold voltage state of the memory cell, and accordingly a logic state associated therewith. The first polarization state and the second polarization state of the remanent-polarizable layer may be stable only in the case that enough compensating positive or negative charges are accumulated in the region of the substrate underneath the remanent-polarizable layer, e.g. at the interface between the remanent-polarizable layer and the IS-stack. In other words, the polarization discontinuity at the interface between the remanent-polarizable layer and the IS-stack should be compensated by free charges. Absence (or lack) of these compensating charges may lead to the generation of a depolarization field, $E_{dep}$, in the remanent-polarizable layer, directed opposite to the direction of the polarization within the remanent-polarizable layer. Such depolarization field, $E_{dep}$, may cause a depolarization of the remanent-polarizable layer, and thus may lead to possible data retention issues for the memory cell. The charge neutrality conditions within the stack of a remanent-polarizable memory cell may be better understood considering a graphical representation of the load line of the remanent-polarizable layer and of the load line of the IS-stack in the charge vs. voltage (Q-V) plane, as will be discussed in further detail below, in relation, for example, to FIG. 2C and FIG. 2D.

Figure 2A:
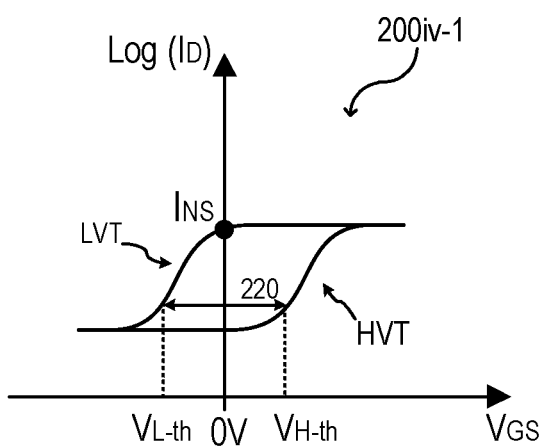
FIG. 2A and FIG. 2B show each a current/voltage characteristic of a memory cell, according to various aspects.
Figure 2B:
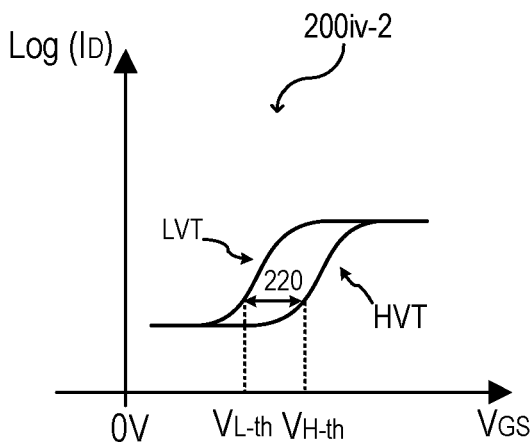

FIG. 2A and FIG. 2B illustrate an electrical behavior of exemplary configurations of a memory cell 102, according to various aspects. The first diagram 200$iv$-1 (see FIG. 2A) and the second diagram 200$iv$-2 (see FIG. 2B) show respectively a current/voltage (I-V) characteristic of the memory cell 102, wherein the logarithm of a current flow from the drain node 102$d$ to the source node 102$s$, Log(ID), e.g. referred to as drain current, ID, is plotted versus the gate-source voltage, $V_{GS}$. The diagrams 200$iv$-1, 200$iv$-2 may refer, for example, to an n-FET based memory cell.

The drain current, ID, may vary as a function of the gate-source voltage, $V_{GS}$, and/or as a function of the memory state (e.g. LVT state or HVT state) the memory cell 102 is residing in. According to various aspects, a current flow through the memory cell 102 may reflect the memory state of the memory cell 102 in the case that the gate voltage, $V_G$, and the source voltage, $V_S$, are provided such that the gate-source voltage, $V_{GS}$, may fall between the first threshold voltage, $V_{L-th}$, and the second threshold voltage, $V_{H-th}$.

According to various aspects, the threshold voltages $V_{L-th}$, $V_{H-th}$ of the memory cell 102 may define a memory window 220 associated with the memory cell 102. The memory window 220 may define a range of gate-source voltages, $V_{GS}$, (e.g. a range of gate voltages, $V_G$, in the case that the source voltage, $V_S$, is 0 V), which may be provided to the memory cell 102 to determine its memory state. A wider memory window 220 may, in some aspects, allow for a more defined distinction between the first memory state and the second memory state, so that the data stored in the memory cell 102 (e.g. a logic "0" or a logic "1") may be determined in a more reliable manner. A wider memory window 220 may, in some aspects, allow for a higher stability of the first memory state and the second memory state, so that the data stored in the memory cell 102 may be determined in a more reliable manner. As an example, the gate-source voltage, $V_{GS}$, may fall within the memory window 220 of the memory cell 102 in the case that the source voltage, $V_S$, is 0 V and the gate voltage, $V_G$, is between the value of the first threshold voltage, $V_{L-th}$, and the value of the second threshold voltage, $V_{H-th}$. In a FeFET memory cell or in a FeFET based memory cell, the size, e.g. the width, of the memory window may approximately be proportional to the coercive field, $E_C$, (e.g. the field required to invert the polarization of the ferroelectric layer) and the thickness, $t_{FE}$, of the ferroelectric layer, according for example to the following expression:

$$MW \sim 2E_C \cdot t_{FE}.$$

In the case that the gate-source voltage, $V_{GS}$, falls within the memory window 220 and the memory cell 102 is residing in the first memory state, e.g. in the LVT state, a conductive state of the memory cell 102 may be detected. According to various aspects, the memory cell 102 may be configured to allow for a substantial current flow (e.g. a current flow higher than 1 nA or higher than 10 nA) between the two source/drain regions in the case that the memory cell 102 is in the first memory state, a gate voltage, $V_G$, is supplied to the gate node 102w of the memory cell 102 that is equal to the first word-line voltage, $V_{WL-1}$, a first source/drain voltage is applied to one of the two source/drain regions that is equal to the first readout voltage, $V_{R,D}$, and a second source/drain voltage is applied to the other one of the two source/drain regions that is equal to the second readout voltage, $V_{R,S}$.

In the case that the gate-source voltage, $V_{GS}$, falls within the memory window 220 and the memory cell 102 is residing in the second memory state, e.g. in the HVT state, a non-conductive state of the memory cell 102 may be detected. According to various aspects the memory cell 102 may be configured to prevent a substantial current flow between the two source/drain regions in the case that the memory cell 102 is in the second memory state, a gate voltage, $V_G$, is supplied to the gate node 102w of the memory cell 102 that is equal to the second word-line voltage, $V_{WL-2}$, (e.g. equal to the base voltage, $V_B$) and/or lower than the first word-line voltage, $V_{WL-1}$, a first source/drain voltage is supplied to one of the two source/drain regions that is equal to the first readout voltage, $V_{R,D}$, and a second source/drain voltage is supplied to the other one of the two source/drain regions that is equal to the second readout voltage, $V_{R,S}$.

Therefore, in the case that a suitable gate-source voltage, $V_{GS}$, is provided, it may be determined based on the presence, absence, and/or size of the current flow, in which memory state the memory cell 102 is residing in. According to various aspects, a current flow in a memory cell 102 lower than a substantial current flow (e.g. lower than 10 nA or lower than 1 nA), may be referred to as prevented or as no substantial current flow.

According to various aspects, independently of the memory state of the memory cell 102, a substantial current flow through the memory cell 102 may be prevented in the case that the gate voltage, $V_G$, and the source voltage, $V_S$, are provided such that the gate-source voltage, $V_{GS}$, is lower than the first threshold voltage, $V_{L-th}$. However, an undesired current flow, INS, may occur in the case that the memory cell 102 is residing in the first memory state, e.g. in the LVT state, and a voltage difference between the first threshold voltage, $V_{L-th}$, and the gate-source voltage, $V_{GS}$, is so small that a current flow, INS, occurs in the memory cell 102. In other words, a current flow, INS, in the memory cell 102 may occur in the case that the first threshold voltage, $V_{L-th}$, of the memory cell 102 is too close to the gate voltage, $V_G$, provided to the memory cell 102, in the case that 0 V are provided as source voltage, $V_S$.

As an example, an undesired current flow, INS, may occur in the memory cells 102 not to be read out in a memory cell arrangement 100, in the case that the memory cells 102 not to be read out reside in the first memory state, and the first threshold voltage, $V_{L-th}$, is too close to the word-line voltage provided to the word-lines, WL, connected to the gate nodes 102w of the memory cells 102 not to be read out. According to various aspects, the memory cell 102 may be configured to allow for a substantial (e.g. higher than 1 nA, higher than 10 nA, etc.) current flow between the two source/drain regions in the case that the memory cell 102 is in the first memory state, a gate voltage, $V_G$, is supplied to the gate node 102w of the memory cell 102 that is equal to the second word-line voltage, $V_{WL-2}$, (e.g. equal to the base voltage, $V_B$) and/or lower than the first word-line voltage, $V_{WL-1}$, a first source/drain voltage is applied to one of the two source/drain regions that is equal to the second word-line voltage, $V_{WL-2}$, and a second source/drain voltage is applied to the other one of the two source/drain regions that is equal to the first readout voltage, $V_{R,D}$, or the second readout voltage, $V_{R,S}$.

In general, in order to avoid an undesired current flow, INS, a gate-source voltage, $V_{GS}$, sufficiently lower than the first threshold voltage, $V_{L-th}$, may be provided by applying zero volts to the source node 102s of the memory cell 102 and a voltage sufficiently lower than the first threshold voltage, $V_{L-th}$, to the gate node 102w of the memory cell 102. However, such a configuration may not be suitable for operating a memory cell arrangement since a large number of control-lines (e.g. word-lines) would have to be charged and discharged during each read out operation to such a gate voltage, and this may not be energy efficient due to losses caused by parasitic capacitances in combination with the charging/discharging of the respective control-lines.

The charging of the control-lines may be avoided by shifting the memory window 220 of the memory cells 102 to positive voltages (see for example FIG. 2B) such that zero volts can be applied to the gate node 102w and the source node 102s of the memory cell 102, while the resulting gate-source voltage, $V_{GS}$, of zero volts may be still below the first threshold voltage, $V_{L-th}$, such that the memory cell 102 may remain non-conductive irrespective of its memory state.

A possible way to shift the memory window 220 may be a targeting of the memory cells 102, for example, by means of ion implantation or by introducing work function metals. By means of targeting, the threshold voltages $V_{L-th}$, $V_{H-th}$ of the memory cells 102 may be shifted (e.g. increased), such that the memory window 220 of the memory cells 102 may be shifted to higher (e.g. in magnitude) gate-source voltage, $V_{GS}$, values, as shown for example in the diagram 200iv-2 in FIG. 2B. The first threshold voltage, $V_{L-th}$, and the second threshold voltage, $V_{H-th}$, of the memory cells 102 may thus be increased, e.g. the magnitude of the first threshold voltage, $V_{L-th}$, and of the second threshold voltage, $V_{H-th}$, may be increased (for example by 1 V, 2 V, 5 V, etc.). As a result, the threshold voltages $V_{L-th}$, $V_{H-th}$, and accordingly the memory window 220 of the memory cells 102 may be sufficiently distantiated from a gate-source voltage, $V_{GS}$, of zero volts, such that the undesired current flow, INS, may be prevented at this gate-source voltage, $V_{GS}$. In other words, the memory window 220 of the memory cells 102 may be shifted, so that in the case that a base voltage, $V_B$, (e.g. 0 V) or a voltage close to the base voltage (e.g. in the range from about −0.25 V to about +0.25 V if the base voltage is 0 V) is applied to both the gate node 102w and the source node 102s of the memory cells 102, those memory cells 102 may prevent a substantial current flow between the respective source node 102s and drain node 102d, irrespective of the memory state they are residing in.

Such a shift of the memory window may be efficient or useful only for some types of memory cells (e.g. only for some types of FET based memory cells, such as for FET based memory cells including a floating gate). For other types of memory cells, the targeting may lead to a degradation of their capabilities, e.g. of their data retention capabilities, for example due to a reduction in their memory window 220 (as shown, for example, in FIG. 2B). As an example, targeting may not be functional for remanent-polarizable (e.g. FeFET or FeFET based) memory cells, which may suffer from reduced data retention. For a remanent-polarizable memory cell, the shifting of the first threshold voltage, $V_{L-th}$, and the second threshold voltage, $V_{H-th}$, e.g. the decentering of the memory window 220, may cause a reduction of the width of the memory window 220 due to an increased depolarization field $E_{dep}$. Thus, for a remanent-polarizable (e.g. FeFET or FeFET based) memory cell, the shifting of the memory window 220 to higher voltages may cause a less reliable operation of the memory cell, e.g. reduced data retention capabilities.

Figure 2C:
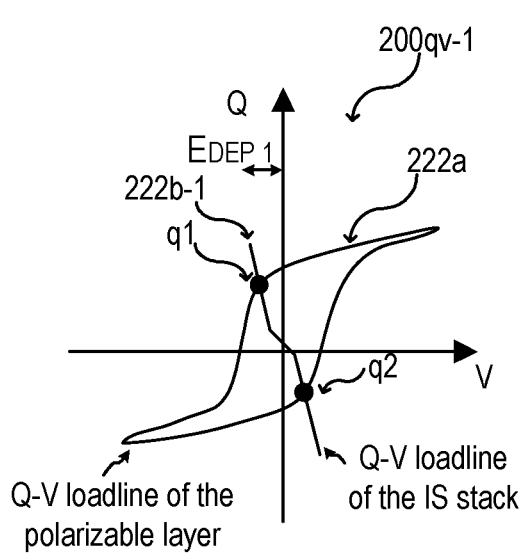
FIG. 2C and FIG. 2D show each a charge/voltage characteristic of a ferroelectric field-effect transistor memory cell, according to various aspects.
Figure 2D:
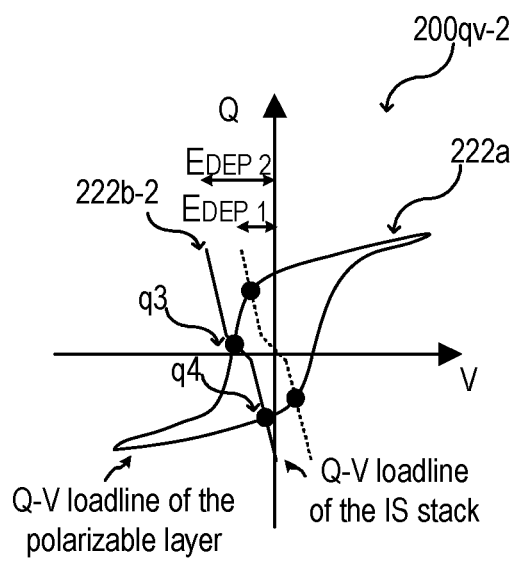

The influence of the depolarization field, $E_{dep}$, on the capabilities of a FeFET memory cell or FeFET based memory cell is explained in further detail below. FIG. 2C and FIG. 2D show two exemplary diagrams 200qv-1, 200qv-2. The diagrams 200qv-1, 200qv-2 include a load line 210a of a ferroelectric memory structure (e.g. a ferroelectric capacitor, also referred to as FeCap) and a load line of an interface-semiconductor-stack (IS-stack) of a FeFET memory cell or FeFET based memory cell in the charge vs. voltage (Q-V) plane. The remanent-polarizable (e.g. ferroelectric) layer of the ferroelectric memory structure may exhibit a hysteresis loop 222a, due to the remanent-polarization in the layer even in absence of an applied field (or in absence of an applied voltage). The operating points (q1, q2, q3, q4) of the memory cell may be defined as the intersection of the remanent-polarization hysteresis 222a and the section-wise defined load line of the IS-stack 222b. The depolarization field $E_{dep}$ may be visualized at zero gate bias by the position of the operating point (q1, q3) on the high capacitance slope of the remanent-polarization hysteresis 222a. In the case that a remanent-polarizable memory cell has a Q-V load line 222b-1 of the IS-stack centered around 0 V, as shown for example in FIG. 2C, it may also have a memory window centered around the current axis of the current/voltage characteristic of the memory cell, similarly to the memory window 220 shown in FIG. 2A.

A memory cell with higher threshold voltages may have a Q-V load line 222b-2 of the IS-stack shifted to the left hand side of the Q-V plane (e.g. decentered with respect to 0 V), as shown for example in FIG. 2D, and it may also have a memory window shifted to larger voltages, as shown for example in FIG. 2B. In this configuration, the depolarization field, $E_{dep2}$, may be increased with respect to the depolarization field, $E_{dep1}$, of a memory cell exhibiting a Q-V load line 222b-1 of the IS-stack centered around 0 V. The increase in the depolarization field may lead to a narrower memory window 220 of the memory cell, as shown, for example, in the diagram 200iv-2 in FIG. 2B. Therefore, the "targeting" solution discussed above for increasing the threshold voltages of a memory cell may not be functionally applicable to a memory arrangement including memory cells whose capabilities (e.g. data retention capabilities) would be degraded in the case that their memory window 220 was shifted.

Without decentering the memory window of a memory cell, in particular applicable for a FeFET memory cell, a negative voltage could be supplied to the gate node of the memory cell while substantially zero volts may be supplied to the source node of the memory cell to avoid a (e.g. undesired) current flow irrespective of the memory state of the memory cell. The application of a suitably high negative voltage may ensure that the provided gate-source voltage, $V_{GS}$, is sufficiently distant from the first threshold voltage, $V_{L-th}$, of the memory cell, so that an undesired current flow INS may be prevented.

However, there may be disadvantages associated with this approach since negative voltages can only be generated with dedicated periphery which may lead to higher overhead in design, and further, in the case that readout operations dominate the overall operation of a memory cell arrangement, the cumulative stress caused by negative voltages (e.g. negative word-line voltages) may act similarly to a shift of the threshold voltage by process modifications (e.g. implantation, work function metals, etc.), thus leading to a deterioration of the data retention properties of the memory cells. Furthermore, the application of negative voltages may also be problematic in terms of energy consumption. This may be due to the fact that all the non-selected word-lines in a memory cell arrangement should be supplied with a negative voltage during every readout operation, thus consuming a significant amount of energy.

According to various aspects, the readout scheme described above in relation to FIG. 1A may allow performing undisturbed readout of data stored in memory cells in a memory cell arrangement, e.g. may allow eliminating readout disturb from non-selected memory cells, while at the same time limiting the impact on the data retention capabilities of the memory cells. The effects of voltages provided to a memory cell according to the readout scheme described above in relation to FIG. 1A are explained in further detail below.

Figure 3A:
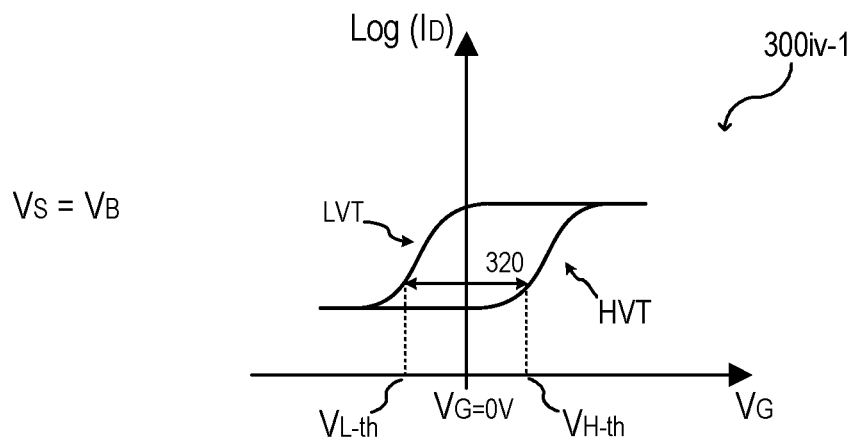
FIG. 3A, FIG. 3B, and FIG. 3C show each a current/voltage characteristic of a ferroelectric field-effect transistor memory cell, according to various aspects.
Figure 3B:
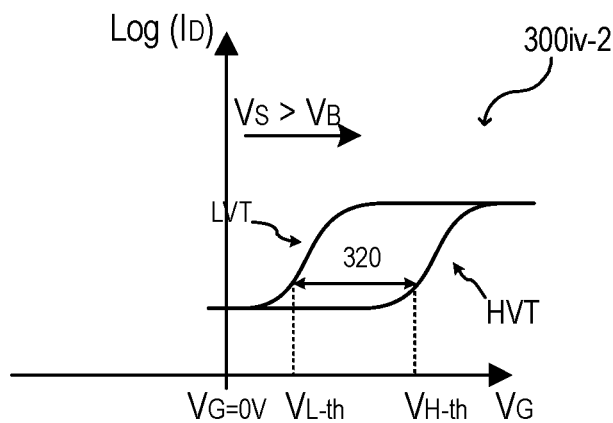
Figure 3C:
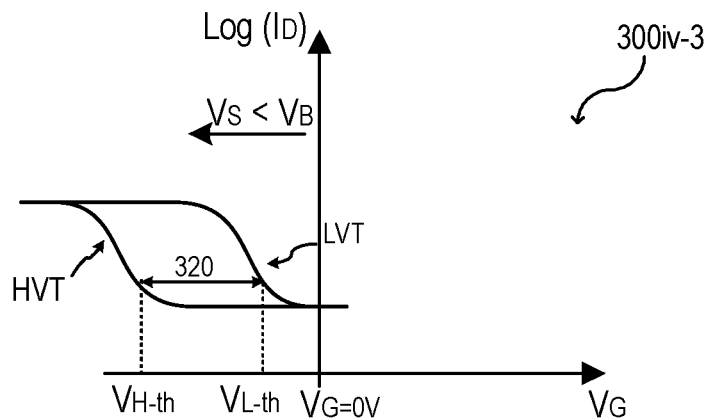

FIG. 3A, FIG. 3B, and FIG. 3C, show each an electrical behavior of a memory cell 102 based on three exemplary diagrams 300iv-1, 300iv-2, 300iv-3. In the diagrams 300iv-1, 300iv-2, 300iv-3, a current/voltage characteristic of the memory cell 102 is illustrated for different values of a source voltage, $V_S$, applied to the source node 102s of the memory cell 102. The current/voltage characteristic includes the logarithm of the drain current, Log(ID), that may flow through the memory cell 102 plotted versus the gate voltage, $V_G$, applied to the gate node 102w of the memory cell 102.

The diagram 300iv-1 shown in FIG. 3A illustrates schematically a current/voltage characteristic of the memory cell 102 with zero volts applied to the source node 102s, i.e. wherein the source voltage, $V_S$, is zero volts or substantially zero volts. Illustratively, in the case that the source voltage, $V_S$, is 0 V, the gate-source voltage, $V_{GS}$, equals the gate voltage, $V_G$, applied at the gate node 102w of the memory cell 102. In this configuration, the memory window 320 of the memory cell 102 may be centered around the zero volts axis, e.g. around $V_G=V_{GS}=0$ V (e.g. defined by the base voltage $V_B$). In this case, the diagram 300iv-1 may be similar to the diagram 200iv-1 shown in FIG. 2A.

According to various aspects, it was found that the memory window 320 of the memory cell 102 may be electronically shifted by applying a source voltage, $V_S$, different (e.g. higher or lower) from 0 V (e.g. different from the base voltage $V_B$) to the source node 102s of the memory cell 102. This may be used to artificially (e.g. virtually) shift the memory window 320 sufficiently distant from $V_G=0$ V, while the gate-source voltage, $V_{GS}$, remains below the first threshold voltage $V_{L-th}$.

According to various aspects, as shown for example in FIG. 3B with reference to an exemplary n-type field-effect transistor based memory cell, in the case that the source voltage, $V_S$, is increased in the positive direction, e.g. to a value larger than 0 V (e.g. 0.1 V, 0.5 V, 1 V, etc.), the memory window 320 of the memory cell 102 may be electronically shifted to higher positive gate voltage, $V_G$, values. According to various aspects, as shown for example in FIG. 3C with reference to an exemplary p-type field-effect transistor based memory cell, in the case that the source voltage, $V_S$, is increased in the negative direction, e.g. to a negative value larger than 0 V (e.g. −0.1 V, −0.5 V, −1 V, etc.), the memory window 320 of the memory cell 102 may be electronically shifted to higher negative gate voltage, $V_G$, values.

Providing a source voltage, $V_S$, different from zero volts (in other words a source voltage, $V_S$ different from a base voltage, $V_B$, of the circuit) to the source node 102s of the memory cell 102, may increase the gate voltage, $V_G$, (e.g. to a more positive or a more negative value, depending on the type of memory cell 102) that should be provided to generate a gate-source voltage, $V_{GS}$, falling within the memory window 320 of the memory cell 102. In other words, the electronical shift of the memory window 320 may be defined by changing the relation of the gate voltage, $V_G$, to the source voltage, $V_S$, to obtain effectively a gate-source voltage, $V_{GS}$, smaller than the first threshold voltage, $V_{L-th}$.

Illustratively, the actual threshold voltages $V_{L-th}$, $V_{H-th}$ of the memory cell may not be influenced (e.g. the dependency of the drain current, ID, on the gate-source voltage, $V_{GS}$), but providing a source voltage, $V_S$, different from zero volts (e.g. different from a base voltage, $V_B$, of the circuit) to the source node 102s of the memory cell 102 may provide a shift of the threshold voltages $V_{L-th}$, $V_{H-th}$ with respect to the gate voltage, $V_G$, e.g. with respect to $V_G$=0 V in diagram 300iv-2 and diagram 300iv-3. The shifting of the memory window 320 may be defined by such corresponding shift of the threshold voltages $V_{L-th}$, $V_{H-th}$ with respect to the gate voltage, $V_G$. In this configuration, larger gate voltages, $V_G$, may be required to have a gate-source voltage, $V_{GS}$, falling within the memory window 320, so that in the case that 0 V (e.g. a base voltage, $V_B$) are provided as gate voltage, $V_G$, a substantial current flow in the memory cell 102 may be prevented (e.g. the gate-source voltage, $V_{GS}$, may be lower than the first threshold voltage, $V_{L-th}$).

According to various aspects, the readout scheme described herein, for example in relation to FIG. 1A, may have the effect of artificially shifting the memory window 320 of the memory cells 102 to higher absolute voltages, so that the undesired current flow, INS, during readout may be substantially eliminated. In addition, the energy consumption may be kept at a low level, since a voltage substantially equal to the base voltage, $V_B$, (e.g. in the range from about −0.25 V to about +0.25 V if the base voltage is 0 V) may be provided during readout to the word-lines corresponding to the memory cells 102 not to be read out.

Figure 4A:
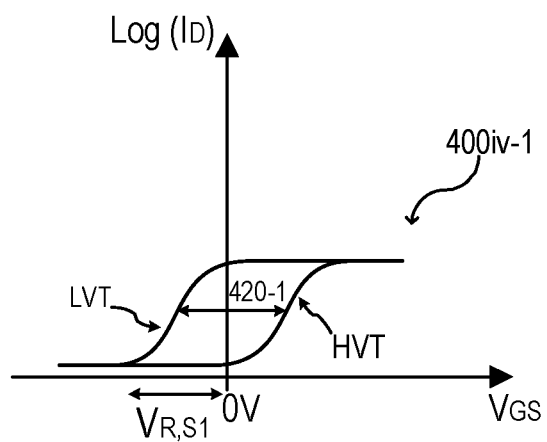
FIG. 4A and FIG. 4B show each a current/voltage characteristic of a memory cell, according to various aspects.
Figure 4B:
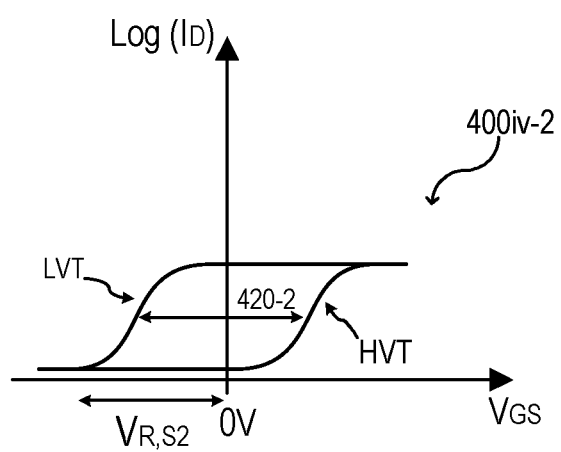

FIG. 4A and FIG. 4B illustrate each schematically an I-V characteristic of two different types of FeFET memory cells or FeFET based memory cells, according to various aspects. The first type of FeFET memory cell (associated, for example, with the diagram 400iv-1 shown in FIG. 4A) may have a first threshold voltage, $V_{L-th1}$, a second threshold voltage, $V_{H-th1}$, and a first memory window 420-1. The second type of FeFET memory cell (associated, for example, with the diagram 400iv-2 shown in FIG. 4B) may have a first threshold voltage, $V_{L-th1}$, a second threshold voltage, $V_{H-th2}$, and a second memory window 420-2. According to various aspects, the second type of memory cell may have a larger coercive field, $E_C$, and/or a larger thickness, $t_{FE}$, of the ferroelectric layer with respect to the first type of memory cell, so that the second memory window 420-2 may be larger (e.g. wider) than the first memory window 420-1.

According to various aspects, the size of the memory window (e.g. the threshold voltages, $V_{L-th}$, $V_{H-th}$) may define the value of the readout voltage (e.g. of the second readout voltage, $V_{R,S}$) to be provided in a readout operation. Illustratively, as discussed above in relation to, for example, FIG. 3A to FIG. 3C, the source voltage, $V_S$, provided to a memory cell (e.g. the second readout voltage, $V_{R,S}$) may artificially shift the memory window so that the gate-source voltage, $V_{GS}$, is lower than the first threshold voltage, $V_{L-th}$, in the case that zero volts are provided as gate voltage, $V_G$. Therefore, according to various aspects, the voltage to be provided as source voltage, $V_S$, (e.g. the second readout voltage, $V_{R,S}$), may be selected to be equal to or larger than the first threshold voltage, $V_{L-th}$ in the case that zero volts are provided as gate voltage, $V_G$.

Illustratively, the larger coercive field, $E_C$, and/or the larger thickness, $t_{FE}$, of the ferroelectric layer of the second type of FeFET memory cell may lead to the second memory cell having a larger memory window 420-2 as the first type of FeFET memory cell, and, as a consequence, to an adjustment of the second readout voltage, $V_{R,S}$, to be applied to the respective source-lines, SL. In the case that the first type of FeFET memory cell was used in a memory cell arrangement, a second readout voltage, $V_{R,S1}$, may be selected, which may be equal to or larger than the first threshold voltage, $V_{L-th1}$, of the first type of FeFET memory cell, so that the gate-source voltage, $V_{GS}$, (e.g. for $V_G$=0 V) would fall outside the memory window 420-1. In the case that the second type of FeFET memory cell was used in a memory cell arrangement, a second readout voltage, $V_{R,S2}$, may be selected, which may be equal to or larger than the first threshold voltage, $V_{L-th2}$, of the second type of FeFET memory cell, so that the gate-source voltage, $V_{GS}$, (e.g. for $V_G$=0 V) would fall outside the memory window 420-2. The second readout voltage, $V_{R,S2}$, selected for operating with the second type of FeFET memory cell may be larger than the second readout voltage, $V_{R,S1}$, selected for operating with the first FeFET memory cell, while maintaining the same gate voltage, $V_G$. The first readout voltage, $V_{R,D}$, may also be adjusted depending on the value of the second readout voltage, $V_{R,S}$.

As a numerical example, the first type of FeFET memory cell may include a ferroelectric film having a coercive field, $E_C$, of 1 MV/cm and a thickness, $t_{FE}$, of 10 nm, and thus the first memory window 420-1 may be 1 V in size. In the case that a memory cell arrangement including such first type of FeFET memory cells is operated, for example, the first word-line voltage, $V_{WL-1}$, (e.g. a select voltage, $V_{sel}$) may be 0.5 V, the second readout voltage, $V_{R,S1}$, applied to the source-line, SL, of the corresponding source/bit-line pair may be 0.5 V, and the first readout voltage, $V_{R,D1}$, applied to the bit-line, BL, of the corresponding source/bit-line pair may be 0.6 V. For the second type of FeFET memory cell including, for example, a ferroelectric film having the same coercive field, $E_C$, as the first type of FeFET memory cell, e.g. 1 MV/cm, and a thickness, $t_{FE}$, which may be a multiple of the thickness, $t_{FE}$, of the ferroelectric film of the first type of FeFET memory cell, e.g. 20 nm, the size of the second memory window 420-2 may also be a multiple of the size of the first memory window 420-1, for example it may be 1 V. In the case that a memory cell arrangement including such second type of FeFET memory cells is operated, for example, the first word-line voltage, $V_{WL-1}$, (e.g. a select voltage, $V_{sel}$) may be 1 V, the second readout voltage, $V_{R,S2}$ applied to the source-line, SL, of the corresponding source/bit-line pair may be a multiple of the second readout voltage, $V_{R,S1}$, applied when operating with the first type of FeFET based memory cell, for example it may be 1 V, and the first readout voltage, $V_{R,D2}$, applied to the bit-line, SL, of the corresponding source/bit-line pair may be 1.1V. Analogous numerical examples may apply for a type of FeFET memory cell including a ferroelectric film having a coercive field, $E_C$, which may be a multiple of the coercive field, $E_C$, of the first type of FeFET memory cell, e.g. 2 MV/cm, and a ferroelectric layer having the same thickness, $t_{FE}$, as the ferroelectric layer of the first type of FeFET memory cell.

Figure 5:
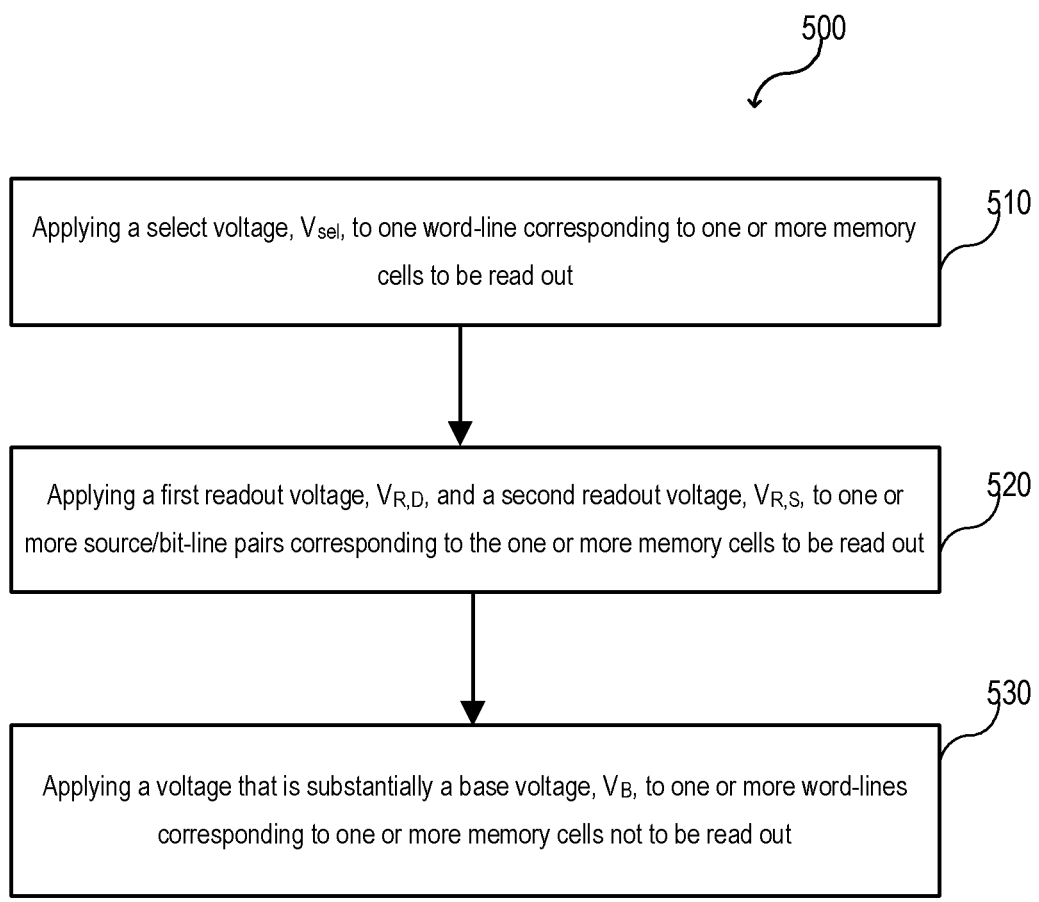
FIG. 5 shows a schematic flow diagram of a method for operating a memory cell arrangement, according to various aspects.

FIG. 5 shows a schematic flow diagram of a method 500, e.g. a method for operating a memory cell arrangement 100, according to various aspects. The method 500 may include, in 510, applying a select voltage, $V_{sel}$, to one word-line, WL, corresponding to a memory cell 102 to be read out; in 520 applying a first readout voltage, $V_{R,D}$, and a second readout voltage, $V_{R,S}$, to a source/bit-line pair corresponding to the memory cell 102 to be read out; in 530 applying a voltage that is substantially a base voltage, $V_B$, (e.g. in the range from about −0.25 V to about +0.25 V if the base voltage is 0 V) to one or more word-lines, WL, corresponding to one or more memory cells 102 not to be read out. According to various aspects, both the first readout voltage, $V_{R,D}$, and the second readout voltage, $V_{R,S}$, may be provided with an offset to the base voltage, $V_B$, to prevent a current flow through the one or more memory cells 102 not to be read out, and the first readout voltage, $V_{R,D}$, and the second readout voltage, $V_{R,S}$, may be different from one another to allow for a readout current flow representing a memory state of the memory cell 102 to be read out.

In the following, various examples are provided that may include one or more aspects described above with reference to the memory cell arrangement 100, and the method 500. It is intended that aspects described in relation to the memory arrangement 100 may apply also to the method 500, and vice versa.

Example 1 is a memory cell arrangement 100 including: a plurality of memory cells 102 including at least one memory cell 102 to be read out and one or more memory cells 102 not to be read out; a control circuit 110 configured to read out the at least one memory cell 102 to be read out, the control circuit 110 defines a base voltage, V, and is configured to: supply a select voltage, $V_{sel}$, to one word-line, WL, corresponding to the at least one memory cell 102 to be read out; supply a first readout voltage, $V_{R,D}$, and a second readout voltage, $V_{R,S}$, to a source/bit-line pair corresponding to the at least one memory cell 102 to be read out; supply a voltage that is substantially the base voltage, V, (e.g. in the range in the range from about −0.25 V to about +0.25 V, in the case that the base voltage is 0 V) to one or more word-lines, WL, corresponding to the one or more memory cells 102 not to be read out; wherein both the first readout voltage, $V_{R,D}$, and the second readout voltage, $V_{R,S}$, are provided with an offset to the base voltage, $V_B$, to prevent a current flow through the one or more memory cells 102 not to be read out, and wherein the first readout voltage, $V_{R,D}$, and the second readout voltage, $V_{R,S}$, are different from one another to allow for a readout current flow representing a memory state of the at least one memory cell 102 to be read out.

In example 2 the memory cell arrangement 100 of example 1 may optionally include that each of the plurality of memory cells 102 is unambiguously assigned to one word-line WL of a set of word-lines and to one source/bit-line pair of a set of source/bit-line pairs.

In example 3 the memory cell arrangement 100 of example 1 or 2 may optionally include that each memory cell 102 of the plurality of memory cells 102 includes a first control node 102w (e.g. a gate node), a second control node 102s (e.g. a source node), and a third control node 102d (e.g. a drain node).

In example 4 the memory cell arrangement 100 of example 3 may optionally include that an electrical behavior of the second control node 102s and the third control node 102d is controlled via the first control node 102w.

In example 5 the memory cell arrangement 100 of example 4 may optionally include that the electrical behavior includes an electrical resistance associated with an electrical current flow between 101 the second control node 102s and the third control node 102d.

In example 6 the memory cell arrangement 100 of any one of examples 1 to 5 may optionally include that each of the plurality of memory cells 102 is a field-effect transistor based memory cell, the field-effect transistor based memory cell including two source/drain regions, a memory structure 104 and a gate structure 106 and is configured to allow for a control of a current flow between the two source/drain regions via a gate voltage (provided to the gate node of the memory cell) as a function of a memory state the memory structure 104 is residing in.

In example 7 the memory cell arrangement 100 of example 6 may optionally include that one of the two source/drain regions of the field-effect transistor based memory cell is connected to a bit-line BL of a corresponding source/bit-line pair, wherein the other one of the two source/drain regions of the field-effect transistor based memory cell is connected to a source-line SL of the corresponding source/bit-line pair, and wherein the memory structure 104 and/or the gate structure 106 of the field-effect transistor based memory cell are/is connected to a corresponding word-line WL.

Further, the memory cell arrangement 100 of examples 3 to 5 may optionally include that the drain node of the respective memory cell is connected to a bit-line BL of a corresponding source/bit-line pair, that the source node of the respective memory cell is connected to a source-line SL of the corresponding source/bit-line pair, and that the gate node of the respective memory cell is connected to a corresponding word-line WL.

In example 8 the memory cell arrangement 100 of example 6 or 7 may optionally include that the field-effect transistor based memory cell is configured to be in one of a plurality of memory states, wherein the plurality of memory states includes a first memory state and a second memory state, and wherein the field-effect transistor based memory cell has a first threshold voltage, $V_{L-th}$, in the first memory state and a second threshold voltage, $V_{H-th}$, in the second memory state.

In example 9 the memory cell arrangement 100 of example 8 may optionally include that the first threshold voltage, $V_{L-th}$, is different from the second threshold voltage, $V_{H-th}$.

In example 10 the memory cell arrangement 100 of example 8 or 9 may optionally include that a voltage difference of the base voltage, $V_B$, and the first threshold voltage, $V_{L-th}$, is less than about 2 V, in particular in the range from about −2 V to about 2 V or in the range from about −1 V to about 1 V.

In example 11 the memory cell arrangement 100 of example 9 or 10 may optionally include that the field-effect transistor based memory cell is configured to allow for a substantial current flow between the two source/drain regions in the case that the field-effect transistor based memory cell is in the first memory state, a gate voltage, $V_G$, is supplied to the memory structure 104 and/or the gate structure 106 of the field-effect transistor based memory cell that is equal to the base voltage, $V_B$, and/or lower than the select voltage, $V_{sel}$, a first source/drain voltage is applied to one of the two source/drain regions that is equal to the base voltage, $V_B$, and a second source/drain voltage is applied to the other one of the two source/drain regions that is equal to the first readout voltage, $V_{R,D}$, or the second readout voltage, $V_{R,S}$.

Further the memory cell may be configured to allow for a substantial current flow between the source node and the drain node in the case that the memory cell is in the first memory state, a gate voltage, $V_G$, is supplied to the gate node of the memory cell that is equal to the base voltage, $V_B$, and/or lower than the select voltage, $V_{sel}$, a source voltage is applied to the source node that is equal to the base voltage, $V_B$, and a drain voltage is applied to the drain node that is equal to the first readout voltage, $V_{R,D}$. Further the memory cell may be configured to allow for a substantial current flow between the source node and the drain node in the case that the memory cell is in the first memory state, a gate voltage, $V_G$, is supplied to the gate node of the memory cell that is equal to the base voltage, $V_B$, and/or lower than the select voltage, $V_{sel}$, a drain voltage is applied to the drain node that is equal to the base voltage, $V_B$, and a source voltage is applied to the source node that is equal to the second readout voltage, $V_{R,S}$.

In example 12 the memory cell arrangement 100 of anyone of examples 9 to 11 may optionally include that the field-effect transistor based memory cell is configured to allow for a substantial current flow between the two source/drain regions in the case that the field-effect transistor based memory cell is in the first memory state a gate voltage is supplied to the memory structure 104 and/or the gate structure 106 of the field-effect transistor based memory cell that is equal to the select voltage, $V_{sel}$, a first source/drain voltage is applied to one of the two source/drain regions that is equal to the base voltage, $V_B$, and a second source/drain voltage is applied to the other one of the two source/drain regions that is equal to the first readout voltage, $V_{R,D}$, or the second readout voltage, $V_{R,S}$.

Further the memory cell may be configured to allow for a substantial current flow between the source node and the drain node in the case that the memory cell is in the first memory state, a gate voltage, $V_G$, is supplied to the gate node of the memory cell that is equal to the select voltage, $V_{sel}$, a source voltage is applied to the source node that is equal to the base voltage, V, and a drain voltage is applied to the drain node that is equal to the first readout voltage, $V_{R,D}$. Further the memory cell may be configured to allow for a substantial current flow between the source node and the drain node in the case that the memory cell is in the first memory state, a gate voltage, $V_G$, is supplied to the gate node of the memory cell that is equal to the select voltage, $V_{sel}$, a drain voltage is applied to the drain node that is equal to the base voltage, V, and a source voltage is applied to the source node that is equal to the second readout voltage, $V_{R,S}$.

In example 13 the memory cell arrangement 100 of anyone of the examples 9 to 12 may optionally include that the field-effect transistor based memory cell is configured to prevent a substantial current flow between the two source/drain regions in the case that the field-effect transistor based memory cell is in the first memory state, a gate voltage, $V_G$, is supplied to the memory structure 104 and/or the gate structure 106 of the field-effect transistor based memory cell that is equal to the base voltage, $V_B$, and/or lower than the select voltage, $V_{sel}$, a first source/drain voltage is applied to one of the two source/drain regions that is equal to the first readout voltage, $V_{R,D}$, and a second source/drain voltage is applied to the other one of the two source/drain regions that is equal to the second readout voltage, $V_{R,S}$.

Further the memory cell may be configured to prevent a substantial current flow between the source node and the drain node in the case that the memory cell is in the first memory state, a gate voltage, $V_G$, is supplied to the gate node of the memory cell that is equal to the base voltage, $V_B$, and/or lower than the select voltage, $V_{sel}$, a source voltage is applied to the source node that is equal to the second readout voltage, $V_{R,S}$, and a drain voltage is applied to the drain node that is equal to the first readout voltage, $V_{R,D}$.

In example 14 the memory cell arrangement 100 of anyone of the examples 9 to 13 may optionally include that a voltage difference of the select voltage, $V_{sel}$ and the first readout voltage, $V_{R,D}$, is greater than the first threshold voltage, $V_{L-th}$.

In example 15 the memory cell arrangement 100 of anyone of the examples 9 to 14 may optionally include that a voltage difference of the select voltage, $V_{sel}$, and the second readout voltage, $V_{R,S}$, is greater than the first threshold voltage, $V_{L-th}$.

In example 16 the memory cell arrangement 100 of anyone of the examples 9 to 15 may optionally include that a voltage difference of the select voltage, $V_{sel}$, and the second readout voltage, $V_{R,D}$, is smaller than the second threshold voltage, $V_{H-th}$.

In example 17 the memory cell arrangement 100 of anyone of the examples 9 to 16 may optionally include that a voltage difference of the select voltage, $V_{sel}$, and the second readout voltage, $V_{R,S}$, is smaller than the second threshold voltage, $V_{H-th}$.

In example 18 the memory cell arrangement 100 of anyone of the examples 9 to 17 may optionally include that the field-effect transistor based memory cell is a n-type field-effect transistor based memory cell, wherein the first threshold voltage, $V_{L-th}$, is lower than the base voltage, $V_B$, the second threshold voltage, $V_{H-th}$, is higher than the base voltage, $V_B$, and both the first readout voltage, $V_{R,D}$, and the second readout voltage, $V_{R,S}$, are higher than the base voltage, $V_B$.

In example 19 the memory cell arrangement 100 of example 18 may optionally include that the select voltage, $V_{sel}$, is higher than the base voltage, $V_B$.

In example 20 the memory cell arrangement 100 of anyone of the examples 9 to 17 may optionally include that the field-effect transistor based memory cell is a p-type field-effect transistor based memory cell, wherein the first threshold voltage, $V_{L-th}$, is higher than the base voltage, $V_B$, the second threshold voltage, $V_{H-th}$, is lower than the base voltage, $V_B$, and both the first readout voltage, $V_{R,D}$, and the second readout voltage, $V_{R,S}$, are lower than the base voltage, $V_B$.

In example 21 the memory cell arrangement 100 of example 20 may optionally include that the select voltage, $V_{sel}$, is lower than the base voltage, $V_B$.

In example 22 the memory cell arrangement 100 of anyone of the examples 1 to 21 may optionally include that the memory cells 102 are ferroelectric field-effect transistor memory cells.

In example 23 the memory cell arrangement 100 of example 22 may optionally include that the ferroelectric field-effect transistor memory cells include ferroelectric $HfO_2$.

In example 24 the memory cell arrangement 100 of anyone of the examples 1 to 23 may optionally include that each memory cell 102 is a non-volatile memory cell.

Example 25 is a method 500 of operating a memory cell arrangement 100, the method including: applying a select voltage, $V_{sel}$, to one word-line, WL, corresponding to at least one memory cell 102 to be read out; applying a first readout voltage, $V_{R,D}$, and a second readout voltage, $V_{R,S}$, to a source/bit-line pair corresponding to the memory cell 102 to be read out; applying a voltage that is substantially a base voltage, $V_B$, to one or more word-lines, WL, corresponding to one or more memory cells 102 not to be read out; wherein both the first readout voltage, $V_{R,D}$, and the second readout voltage, $V_{R,S}$, may be provided with an offset to the base voltage, $V_B$, to prevent a substantial current flow through the one or more memory cells 102 not to be read out, and the first readout voltage, $V_{R,D}$, and the second readout voltage, $V_{R,S}$, may be different from one another to allow for a readout current flow representing a memory state of the memory cell 102 to be read out.

Example 26 is a memory cell arrangement 100, including: a plurality of memory cells 102 including at least one memory cell 102 to be read out and one or more memory cells 102 not to be read out; a control circuit 110 configured to read out the at least one memory cell 102 to be read out, wherein the control circuit 110 defines a base voltage, $V_B$, and is configured to: allow for a substantial current flow in the at least one memory cell 102 to be read out by supplying a select voltage, $V_{sel}$, to a gate node 102w of the at least one memory cell 102 to be read out, a first readout voltage, $V_{R,D}$, to a drain node 102d of the at least one memory cell to be read out and a second readout voltage, $V_{R,S}$, to a source node 102s of the at least one memory cell 102 to be read out; prevent a substantial current flow in the one or more memory cells 102 not to be read out by supplying substantially the base voltage, $V_B$, to a gate terminal 102w, a drain terminal 102d, and a source terminal 102s of each memory cell 102 of the one or more memory cells 102 not to be read out; wherein both the first readout voltage, $V_{R,D}$, and the second readout voltage, $V_{R,S}$, are either higher than or lower than the base voltage, $V_B$, to prevent a substantial current flow in the memory cells 102 not to be read out which share a drain connection and/or a source connection with the memory cell 102 to be read out; and wherein the first readout voltage, $V_{R,D}$, and the second readout voltage, $V_{R,S}$, are different from one another, to allow for a substantial current flow from the drain terminal 102d to the source terminal 102s of the at least one memory cell 102 to be read out.

Example 27 is a memory cell arrangement 100 including: a plurality of memory cells 102; a source/bit line pair coupled to a first subset of the plurality of memory cells 102; a set of word-lines, each word-line, WL, of the set of word-lines coupled to a corresponding memory cell 102 of the first subset; a control circuit 110 configured to read out a memory cell 102 of the first subset, the control circuit 110 is configured to: supply a first word-line voltage, $V_{WL-1}$, to a word-line, WL, of the set of word-lines corresponding to the memory cell 102 of the first subset to be read out; supply a second word-line voltage, $V_{WL-2}$, to one or more word-lines, WL, of the set of word-lines corresponding to one or more memory cells 102 of the first subset not to be read out, wherein the second word-line voltage, $V_{WL-2}$, is in the range from a base voltage, $V_B$, of the control circuit 110 to the first word-line voltage, $V_{WL-1}$; supply a first readout voltage, $V_{R,D}$, and a second readout voltage, $V_{R,S}$, to the source/bit-line pair (that is coupled to the memory cells 102 of the first subset); wherein both the first readout voltage, $V_{R,D}$, and the second readout voltage, $V_{R,S}$, have an offset to the second word-line voltage, $V_{WL-2}$, to prevent a current flow through the one or more memory cells 102 of the first subset not to be read out, and wherein the first readout voltage, $V_{R,D}$, and the second readout voltage, $V_{R,S}$, are different from one another to allow for a readout current flow representing a memory state of the memory cell 102 of the first subset to be read out.

Example 28 is a memory cell arrangement 100 including: a plurality of memory cells 102, each of the memory cells 102 have one of a first threshold voltage, $V_{L-th}$, and a second threshold voltage, $V_{H-th}$, as a function of a memory state the memory cell 102 is residing in; a source/bit-line pair coupled to a first subset of the plurality of memory cells 102; a set of word-lines, each word-line, WL, of the set of word-lines coupled to a corresponding memory cell 102 of the first subset; a control circuit 110 configured to read out a memory cell 102 of the first subset, the control circuit may be configured to: supply a first word-line voltage, $V_{WL-1}$, to a word-line, WL, of the set of word-lines corresponding to the memory cell 102 of the first subset to be read out; supply a second word-line voltage, $V_{WL-2}$, to one or more word-lines, WL, of the set of word-lines corresponding to one or more memory cells 102 of the first subset not to be read out, the second word-line voltage, $V_{WL-2}$, is between the first threshold voltage, $V_{L-th}$, and the second threshold voltage, $V_{H-th}$; supply a first readout voltage, $V_{R,D}$, and a second readout voltage, $V_{R,S}$, to the source/bit-line pair (that is coupled to the memory cells 102 of the first subset); wherein both the first readout voltage, $V_{R,D}$, and the second readout voltage, $V_{R,S}$, have a voltage offset to the second word-line voltage, $V_{WL-2}$, to prevent a current flow through the one or more memory cells 102 of the first subset not to be read out, and wherein the first readout voltage, $V_{R,D}$, and the second readout voltage, $V_{R,S}$, are different from one another to allow for a readout current flow representing a memory state of the memory cell 102 of the first subset to be read out. The absolute value of the voltage offset may be equal to or greater than the voltage difference between the second word-line voltage, $V_{WL-2}$, and the first threshold voltage, $V_{L-th}$, wherein the voltage offset is positive in the case that the first threshold voltage, $V_{L-th}$, is negative and wherein the voltage offset is negative in the case that the first threshold voltage, $V_{L-th}$, is positive. The voltage offset may be positive in the case that each of the memory cells 102 is a p-type memory cell and the voltage offset may be negative in the case that each of the memory cells 102 is an n-type memory cell.

Example 29 is a memory cell arrangement 100 including: a plurality of memory cells 102 including one or more first subsets of memory cells 102 and second subsets of memory cells 102, the memory cells 102 of each of the one or more fist subsets being connected to a common source-line, SL, and a common bit-line, BL, and the memory cells 102 of each of the second subsets being connected to a common word-line, WL. The memory cell arrangement 100 may include a control circuit 110 to read out a memory cell 102 to be read out, the memory cell 102 to be read out is included in one of the one or more first subsets and in one of the second subsets, wherein the first subset further includes one or more memory cells 102 not to be read out. The control circuit 110 may have a base voltage, $V_B$, associated therewith and may be configured to: provide a first gate-source voltage, $V_{GS-1}$, to the memory cell 102 to be read out by supplying a source voltage, $V_S$, and a first gate voltage, $V_{G-1}$, to the corresponding source-line, SL, and word-line, WL, respectively; and provide a second gate-source voltage, $V_{GS-2}$, to the one or more memory cells 102 not to be read out by supplying a second gate voltage, $V_{G-2}$, different from the first gate voltage, $V_{G-1}$, to the corresponding one or more word-lines, WL. The source voltage, $V_S$, may be provided with an offset to the base voltage, $V_B$, such that a source/drain current flow through the memory cell 102 to be read out is a function of a memory state the memory cell 102 to be read out is residing in, and such that a source/drain current flow through each of the one or more memory cells 102 not to be read out is prevented independently from a memory state the respective memory cell 102 not to be read out is residing in.

In example 30, the memory cell arrangement 100 of example 29 may optionally include that the control circuit 110 is further configured to provide a third gate-source voltage, $V_{GS-3}$, to one or more memory cells 102 not to be read out which are in a same second subset as the memory cell 102 to be read out by supplying a voltage that is substantially the base voltage, $V_B$, to the corresponding one or more source-lines, SL.

In example 31, the memory cell arrangement 100 of example 30 may optionally include that the control circuit 110 is further configured to supply a voltage that is substantially the base voltage, $V_B$, to one or more bit-lines, BL, corresponding to the one or more memory cells 102 not to be read out which are in the same second subset as the memory cell 102 to be read out.

In example 32, the memory cell arrangement 100 of example 30 or 31 may optionally include that the control circuit 110 is further configured to provide a fourth gate-source voltage, $V_{GS-4}$, to one or more of the memory cells 102 of the plurality of memory cells 102 which are not in the same first subset as the memory cell 102 to be read out and not in the same second subset as the memory cell 102 to be read out, wherein the fourth gate-source voltage, $V_{GS-4}$, is substantially zero.

Example 33 is a memory cell arrangement 100 including: a plurality of memory cells 102 including one or more memory cells 102 to be read out and one or more memory cells 102 not to be read out, a control circuit 110 configured to read out the one or more memory cells 102 to be read out. The control circuit may define a base voltage, $V_B$, and may be configured to: supply a select voltage, $V_{sel}$, to a word-line, WL, corresponding to the one or more memory cells 102 to be read out; supply a first readout voltage, $V_{R,D}$, and a second readout voltage, $V_{R,S}$, to each of one or more source/bit-line pairs corresponding to the one or more memory cells 102 to be read out; and supply a voltage that is substantially the base voltage, $V_B$, (e.g. in the range from about −0.25 V to about +0.25 V if the base voltage is 0 V) to one or more word-lines, WL, corresponding to the one or more memory cells 102 not to be read out. According to various aspects, both the first readout voltage, $V_{R,D}$, and the second readout voltage, $V_{R,S}$, may be provided with an offset to the base voltage, $V_B$, to prevent a current flow through the one or more memory cells 102 not to be read out, and the first readout voltage, $V_{R,D}$, and the second readout voltage, $V_{R,S}$, may be different from one another to allow for a readout current flow representing a respective memory state of the one or more memory cells 102 to be read out. Further, a voltage that is substantially the base voltage, $V_B$, (e.g. a voltage in the range from about −0.25 V to about +0.25 V if the base voltage is 0 V) may be supplied to each of one or more source/bit line pairs not corresponding to the one or more memory cells 102 to be read out.

Example 34 is a memory cell arrangement 100 including: a plurality of memory cells 102, a set of source/bit-line pairs, each source/bit-line pair of the set of source/bit-line pairs coupled to a first subset of the plurality of memory cells 102, a set of word-lines, each word-line, WL, of the set of word-lines coupled to a second subset of the plurality of memory cells 102, a control circuit 110 to read out one or more memory cells 102 of the plurality of memory cells 102 (illustratively, one or more memory cells 102 of a second subset). The control circuit 110 may be configured to: supply a first word-line voltage, $V_{WL-1}$, to a word-line, WL, of the set of word-lines corresponding to the one or more memory cells 102 to be read out; supply a second word-line voltage, $V_{WL-2}$, to each word-line of the set of word-lines not corresponding to the one or more memory cells 102 to be read out, wherein the second word-line voltage, $V_{WL-2}$, may be in the range from a base voltage, $V_B$, of the control circuit 110 to the first word-line voltage, $V_{WL-1}$; supply a readout voltage pair to each source/bit-line pair of the set of source/bit-line pairs corresponding to the one or more memory cells 102 to be read out. Both a first readout voltage, $V_{R,D}$, and a second readout voltage, $V_{R,S}$, of each readout voltage pair may have an offset to the second word-line voltage, $V_{WL-2}$, to prevent a current flow through all memory cells 102 of the respective first subset not to be read out, and the first readout voltage, $V_{R,D}$, and the second readout voltage, $V_{R,S}$, may be different from one another to allow for a readout current flow representing a memory state of the memory cell 102 of the respective first subset to be read out. Further, a first source/drain voltage, $V_D$, and a second source/drain voltage, $V_S$, may be supplied to the one or more source/bit-line pairs not corresponding to the one or more memory cells 102 to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

Example 35 is a memory cell arrangement 100 including: a plurality of memory cells 102, each of the memory cells 102 may have a first threshold voltage, $V_{L-th}$, and a second threshold voltage, $V_{H-th}$, as a function of a memory state the memory cell 102 is residing in, a set of source/bit-line pairs, each source/bit-line pair of the set of source/bit-line pairs coupled to a first subset of the plurality of memory cells 102, a set of word-lines, each word-line, WL, of the set of word-lines coupled to a second subset of the plurality of memory cells 102, a control circuit 110 to read out one or more memory cells 102 of the plurality of memory cells 102 (illustratively, one or more memory cells 102 of a second subset). The control circuit 110 may be configured to: supply a first word-line voltage, $V_{WL}$, to a word-line, WL, of the set of word-lines corresponding to the one or more memory cells 102 to be read out; supply a second word-line voltage, $V_{WL-2}$, to one or more word-lines, WL, of the set of word-lines not corresponding to the one or more memory cells 102 to be read out, wherein the second word-line voltage, $V_{WL-2}$, is between the first threshold voltage, $V_{L-th}$, and the second threshold voltage, $V_{H-th}$; supply a first readout voltage, $V_{R,D}$, and a second readout voltage, $V_{R,S}$, to each of the one or more source/bit-line pairs coupled to the one or more memory cells 102 to be read-out. Both the first readout voltage $V_{R,D}$, and the second readout voltage, $V_{R,S}$, may have a voltage offset to the second word-line voltage, $V_{WL-2}$, to prevent a current flow through one or more memory cells 102 of the respective first subset not to be read out, and the first readout voltage $V_{R,D}$, and the second readout voltage $V_{R,S}$, may be different from one another to allow for a readout current flow representing a memory state of the memory cell 102 of the respective first subset to be read out. The absolute value of the voltage offset may be greater than the voltage difference between the second word-line voltage, $V_{WL-2}$, and the first threshold voltage, $V_{L-th}$. The voltage offset may be positive in the case that the first threshold voltage, $V_{L-th}$, is negative, and the voltage offset may be negative in the case that the first threshold voltage, $V_{L-th}$, is positive. The voltage offset may be positive in the case that each of the memory cells 102 is a p-type memory cell, and the voltage offset may be negative in the case that each of the memory cells 102 is an n-type memory cell. Further, a first source/drain voltage, $V_D$, and a second source/drain voltage, $V_S$, may be supplied to the one or more source/bit-line pairs not corresponding to the one or more memory cells 102 to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

Example 36 is a memory cell arrangement 100 including: a plurality of memory cells 102 including one or more first subsets of memory cells 102 and second subsets of memory cells 102, the memory cells 102 of each of the one or more fist subsets being connected to a common source-line, SL, and a common bit-line, BL, and the memory cells 102 of each of the second subsets being connected to a common word-line, WL. The memory cell arrangement 100 may include a control circuit 110 to read out one or more memory cells 102 to be read out, each memory cell 102 to be read out is included in one of the one or more first subsets and in one of the second subsets, wherein each respective first subset further includes one or more memory cells 102 not to be read out. The control circuit 110 may have a base voltage, $V_B$, associated therewith and may be configured to: provide a first gate-source voltage, $V_{GS}$-1, to the one or more memory cell 102 to be read out by supplying a source voltage, $V_S$, and a first gate voltage, $V_{G-1}$, to the corresponding source-line(s), SL, and word-line(s), WL, respectively; and provide a second gate-source voltage, $V_{GS-2}$, to the one or more memory cells 102 not to be read out by supplying a second gate voltage, $V_{G-2}$, different from the first gate voltage, $V_{G-1}$, to the corresponding one or more word-lines, WL. The source voltage, $V_S$, may be provided with an offset to the base voltage, $V_B$, such that a source/drain current flow through each memory cell 102 to be read out is a function of a memory state the respective memory cell 102 to be read out is residing in, and such that a source/drain current flow through each of the one or more memory cells 102 not to be read out is prevented independently from a memory state the respective memory cell 102 not to be read out is residing in.

Example 37 is a method 500 for operating a memory cell arrangement 100 including: applying a select voltage, $V_{sel}$, to a word-line, WL, corresponding to one or more memory cells 102 to be read out; applying a first readout voltage, $V_{R,D}$, and a second readout voltage, $V_{R,S}$, to each of one or more source/bit-line pairs corresponding to the one or more memory cells 102 to be read out; and applying a voltage that is substantially a base voltage, $V_B$, (e.g. in the range from about −0.25 V to about +0.25 V if the base voltage is 0 V) to one or more word-lines, WL, not corresponding to the one or more memory cells 102 to be read out. Both the first readout voltage, $V_{R,D}$, and the second readout voltage, $V_{R,S}$, may be provided with an offset to the base voltage, $V_B$, to prevent a current flow through one or more memory cells 102 not to be read out, and the first readout voltage, $V_{R,D}$, and the second readout voltage, $V_{R,S}$, may be different from one another to allow for a readout current flow representing a memory state of the corresponding memory cell 102 to be read out. Further, a first source/drain voltage, $V_D$, and a second source/drain voltage, $V_S$, may be supplied to the one or more source/bit-line pairs not corresponding to the one or more memory cells 102 to be read out. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

Example 38 is a memory cell arrangement 100 including: a plurality of memory cells 102 including a first memory cell 102 and one or more second memory cells 102, a control circuit 110 configured to read out the first memory cell 102, the control circuit 110 defines a base voltage, $V_B$, and is configured to: supply a select voltage, $V_{sel}$, to a word-line, WL, corresponding to the first memory cell 102; supply a first readout voltage, $V_{R,D}$, and a second readout voltage, $V_{R,S}$, to at least one source/bit-line pair corresponding to the first memory cell 102; supply a voltage that is substantially the base voltage, $V_B$, to one or more word-lines, WL, corresponding to the one or more second memory cells 102 (or not corresponding to the first memory cell 102); wherein both the first readout voltage, $V_{R,D}$, and the second readout voltage, $V_{R,S}$, are provided with an offset to the base voltage, $V_B$, to prevent a current flow through the one or more second memory cells 102, and wherein the first readout voltage, $V_{R,D}$, and the second readout voltage, $V_{R,S}$, are different from one another to allow for a readout current flow representing a memory state of the first memory cell 102.

Example 39 is a memory cell arrangement 100 including: a plurality of memory cells 102 including one or more first subsets of memory cells 102 and second subsets of memory cells 102, the memory cells 102 of each of the one or more first subsets being connected to a common source-line, SL, and a common bit-line, BL, and the memory cells 102 of each of the second subsets being connected to a common word-line, WL; a control circuit 110 to read out a first memory cell 102, the first memory cell 102 is included in one of the one or more first subsets and in one of the second subsets, the first subset further including one or more second memory cells 102, the control circuit 110 has a base voltage, $V_B$, associated therewith and is configured to: provide a first gate source voltage, $V_{GS-1}$, to the first memory cell 102 by supplying a source voltage, $V_S$, and a first gate voltage, $V_{G-1}$, to the corresponding source-line, SL, and word-line, WL, respectively, and provide a second gate source voltage, $V_{GS-2}$, to the one or more second memory cells 102 by supplying a second gate voltage, $V_{G-2}$, different from the first gate voltage, $V_{G-1}$, to the corresponding one or more word lines, WL, wherein the source voltage, $V_S$, has an offset to the base voltage, $V_B$, such that a source/drain current flow through the first memory cell 102 is a function of a memory state the first memory cell 102 is residing in, and such that a source/drain current flow through each of the one or more second memory cells 102 is prevented independently from a memory state the respective second memory cell 102 is residing in.

In example 40, the memory cell arrangement 100 of example 39 may optionally include that the control circuit 110 is further configured to provide a third gate-source voltage, $V_{GS-3}$, to one or more third memory cells 102 which are in a same second subset as the first memory cell 102 by supplying a voltage that is substantially the base voltage, $V_B$, to the corresponding one or more source-lines, SL.

In example 41, the memory cell arrangement of example 40 may optionally include that the control circuit 110 is further configured to supply a voltage that is substantially the base voltage, $V_B$, to one or more bit-lines, BL, corresponding to the one or more third memory cells 102.

In example 42, the memory cell arrangement of example 40 or 41 may optionally include that the control circuit 110 is further configured to provide a fourth gate-source voltage, $V_{GS-4}$, to one or more fourth memory cells 102 of the plurality of memory cells 102 which are not in the same first subset as the first memory cell 102 and not in the same second subset as the first memory cell 102, wherein the fourth gate-source voltage, $V_{GS-4}$, is substantially zero.

Example 43 is a method 500 for operating a memory cell arrangement 100 including: applying a select voltage, $V_{sel}$, to a word-line, WL, corresponding to one or more first memory cells 102; applying a first readout voltage, $V_{R,D}$, and a second readout voltage, $V_{R,S}$, to each of one or more source/bit-line pairs corresponding to the one or more first memory cells 102; and applying a voltage that is substantially a base voltage, $V_B$, (e.g. in the range from about −0.25 V to about +0.25 V if the base voltage is 0 V) to one or more word-lines corresponding to one or more second memory cells 102. Both the first readout voltage, $V_{R,D}$, and the second readout voltage, $V_{R,S}$, may be provided with an offset to the base voltage, $V_B$, to prevent a current flow through the one or more second memory cells 102, and the first readout voltage, $V_{R,D}$, and the second readout voltage, $V_{R,S}$, may be different from one another to allow for a readout current flow representing a memory state of the corresponding first memory cell 102. Further, a first source/drain voltage, $V_D$, and a second source/drain voltage, $V_S$, may be supplied to the one or more source/bit-line pairs not corresponding to the one or more first memory cells 102. The first source/drain voltage, $V_D$, may be equal to the second source/drain voltage, $V_S$. The first source/drain voltage, $V_D$, and the second source/drain voltage, $V_S$, may be equal to the base voltage, $V_B$, or may be selected close to the base voltage, e.g. in the range from about −0.25 V to about +0.25 V if the base voltage is 0 V.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell arrangement, comprising:
 a plurality of memory cells comprising at least one memory cell to be read out and one or more memory cells not to be read out,
 a control circuit configured to read out the at least one memory cell to be read out, the control circuit defines a base voltage and is configured to:
 supply a select voltage to a word-line corresponding to the at least one memory cell to be read out;
 supply a first readout voltage and a second readout voltage to at least one source/bit-line pair corresponding to the at least one memory cell to be read out;
 supply a voltage that is substantially the base voltage to one or more word-lines not corresponding to the at least one memory cell to be read out;
 wherein both the first readout voltage and the second readout voltage are provided with a non-zero voltage offset with respect to the base voltage to prevent a current flow through the one or more memory cells not to be read out, and wherein the first readout voltage and the second readout voltage are different from one another to allow for a readout current flow representing a memory state of the at least one memory cell to be read out.

2. The memory cell arrangement of claim 1, wherein each of the plurality of memory cells is unambiguously assigned to one word-line and to one source/bit-line pair.

3. The memory cell arrangement of claim 1, wherein each of the plurality of memory cells is a field-effect transistor based memory cell, the field-effect transistor based memory cell comprising two source/drain regions, a memory structure, and a gate structure.

4. The memory cell arrangement of claim 3, wherein one of the two source/drain regions of the field-effect transistor based memory cell is connected to a bit-line of a corresponding source/bit-line pair, wherein the other one of the two source/drain regions of the field-effect transistor based memory cell is connected to a source-line of the corresponding source/bit-line pair, and wherein at least one of the memory structure and the gate structure of the field-effect transistor based memory cell is connected to a corresponding word-line.

5. The memory cell arrangement of claim 3, wherein the field-effect transistor based memory cell is configured to be in one of a plurality of memory states, wherein the plurality of memory states comprises a first memory state and a second memory state, and wherein the field-effect transistor based memory cell has a first threshold voltage in the first memory state and a second threshold voltage in the second memory state.

6. The memory cell arrangement of claim 5, wherein a voltage difference of the base voltage and the first threshold voltage is less than about 2 V, in particular in the range from about −2 V to about 2 V or in the range from about −1 V to about 1 V.

7. The memory cell arrangement of claim 5, wherein the field-effect transistor based memory cell is configured to allow for a substantial current flow between the two source/drain regions in the case that the field-effect transistor based memory cell is in the first memory state, a gate voltage is supplied to the field-effect transistor based memory cell that is equal to the base voltage and/or lower than the select voltage, a first source/drain voltage is supplied to one of the two source/drain regions that is equal to the base voltage, and a second source/drain voltage is supplied to the other one of the two source/drain regions that is equal to the first readout voltage or the second readout voltage.

8. The memory cell arrangement of claim 5, wherein the field-effect transistor based memory cell is configured to prevent a substantial current flow between the two source/drain regions in the case that the field-effect transistor based memory cell is in the first memory state, a gate voltage is supplied to the field-effect transistor based memory cell that is equal to the base voltage and/or lower than the select voltage, a first source/drain voltage is supplied to one of the two source/drain regions that is equal to the first readout voltage, and a second source/drain voltage is supplied to the other one of the two source/drain regions that is equal to the second readout voltage.

9. The memory cell arrangement of claim 5,
wherein the field-effect transistor based memory cell is configured to allow for a substantial current flow between the two source/drain regions in the case that the field-effect transistor based memory cell is in the first memory state, a gate voltage is supplied to the field-effect transistor based memory cell that is equal to the select voltage, a first source/drain voltage is supplied to one of the two source/drain regions that is equal to the first readout voltage, and a second source/drain voltage is supplied to the other one of the two source/drain regions that is equal to the second readout voltage.

10. The memory cell arrangement of claim 5,
wherein a voltage difference of the select voltage and the first readout voltage is equal to or greater than the first threshold voltage.

11. The memory cell arrangement of claim 10,
wherein a voltage difference of the select voltage and the second readout voltage is equal to or greater than the first threshold voltage.

12. The memory cell arrangement of claim 5,
wherein the field-effect transistor based memory cell is a n-type field-effect transistor based memory cell, wherein the first threshold voltage is lower than the base voltage, the second threshold voltage is higher than the base voltage, and both the first readout voltage and the second readout voltage are higher than the base voltage.

13. The memory cell arrangement of claim 12, wherein the select voltage is higher than the base voltage.

14. The memory cell arrangement of claim 5,
wherein the field-effect transistor based memory cell is a p-type field-effect transistor based memory cell, wherein the first threshold voltage is higher than the base voltage, the second threshold voltage is lower than the base voltage, and both the first readout voltage and the second readout voltage are lower than the base voltage.

15. The memory cell arrangement of claim 14,
wherein the select voltage is lower than the base voltage.

16. A memory cell arrangement comprising:
a plurality of memory cells comprising one or more first subsets of memory cells and second subsets of memory cells, the memory cells of each of the one or more first subsets being connected to a common source-line and a common bit-line and the memory cells of each of the second subsets being connected to a common word-line;
a control circuit to read out a memory cell to be read out, the memory cell to be read out is comprised in one of the one or more first subsets and in one of the second subsets, the first subset further comprising one or more memory cells not to be read out, the control circuit has a base voltage associated therewith and is configured to:
provide a first gate-source voltage to the memory cell to be read out by supplying a source voltage and a first gate voltage to the corresponding source-line and word-line respectively, and
provide a second gate-source voltage to the one or more memory cells not to be read out by supplying a second gate voltage different from the first gate voltage to the corresponding one or more word-lines,
wherein the source voltage has a non-zero voltage offset with respect to the base voltage such that a source/drain current flow through the memory cell to be read out is a function of a memory state the memory cell to be read out is residing in, and such that a source/drain current flow through each of the one or more memory cells not to be read out is prevented independently from a memory state the respective memory cell not to be read out is residing in.

17. The memory cell arrangement of claim 16,
wherein the control circuit is further configured to:
provide a third gate-source voltage to one or more memory cells not to be read out which are in a same second subset as the memory cell to be read out by supplying a voltage that is substantially the base voltage to the corresponding one or more source-lines.

18. The memory cell arrangement of claim 17,
wherein the control circuit is further configured to:
supply a voltage that is substantially the base voltage to one or more bit-lines corresponding to the one or more memory cells not to be read out which are in the same second subset as the memory cell to be read out.

19. The memory cell arrangement of claim 17,
wherein the control circuit is further configured to:
provide a fourth gate-source voltage to one or more of the memory cells of the plurality of memory cells which are not in the same first subset as the memory cell to be read out and not in the same second subset as the memory cell to be read out, wherein the fourth gate-source voltage is substantially zero.

20. A method for operating a memory cell arrangement, the method comprising:
applying a select voltage to a word-line corresponding to at least one memory cell to be read out;
applying a first readout voltage and a second readout voltage to a source/bit-line pair corresponding to the at least one memory cell to be read out;
applying a voltage that is substantially a base voltage to one or more word-lines not corresponding to the at least one memory cell to be read out;
wherein both the first readout voltage and the second readout voltage are provided with a non-zero voltage offset with respect to the base voltage to prevent a current flow through one or more memory cells not to be read out, and wherein the first readout voltage and the second readout voltage are different from one another to allow for a readout current flow representing a memory state of the at least one memory cell to be read out.

* * * * *